United States Patent
Nakayama et al.

(10) Patent No.: US 8,040,186 B2
(45) Date of Patent: Oct. 18, 2011

(54) RADIO FREQUENCY AMPLIFIER CIRCUIT AND MOBILE COMMUNICATION TERMINAL USING THE SAME

(75) Inventors: Masao Nakayama, Shiga (JP); Hiroshi Sugiyama, Osaka (JP); Kazuhiko Oohashi, Kyoto (JP); Kouki Yamamoto, Shiga (JP); Kaname Motoyoshi, Hyogo (JP)

(73) Assignee: Panasonic Corporation, Osaka (JP)

( * ) Notice: Subject to any disclaimer, the term of this patent is extended or adjusted under 35 U.S.C. 154(b) by 191 days.

(21) Appl. No.: 12/626,056

(22) Filed: Nov. 25, 2009

(65) Prior Publication Data

US 2010/0134189 A1    Jun. 3, 2010

Related U.S. Application Data

(62) Division of application No. 11/808,157, filed on Jun. 7, 2007, now Pat. No. 7,639,080.

(30) Foreign Application Priority Data

Jun. 7, 2006  (JP) .................................. 2006-158452

(51) Int. Cl.
H03G 3/10  (2006.01)
(52) U.S. Cl. ..................... 330/285; 330/289; 330/133
(58) Field of Classification Search .................. 330/285, 330/289, 133
See application file for complete search history.

(56) References Cited

U.S. PATENT DOCUMENTS

| | | | |
|---|---|---|---|
| 6,331,799 B1 | 12/2001 | Miyazawa | |
| 6,452,454 B1 * | 9/2002 | Shapiro et al. | 330/289 |
| 6,566,954 B2 | 5/2003 | Miyazawa | |
| 6,690,237 B2 * | 2/2004 | Miyazawa | 330/285 |
| 6,842,075 B2 * | 1/2005 | Johnson et al. | 330/296 |
| 6,946,911 B2 | 9/2005 | Yang et al. | |
| 6,946,913 B2 | 9/2005 | Moriwaki et al. | |
| 7,038,546 B2 | 5/2006 | Kuriyama | |
| 7,057,462 B2 | 6/2006 | Kang et al. | |
| 7,504,887 B2 * | 3/2009 | Masuda et al. | 330/289 |
| 7,768,354 B2 * | 8/2010 | Matsuda et al. | 330/299 |
| 7,872,532 B2 * | 1/2011 | Ishihara et al. | 330/289 |

FOREIGN PATENT DOCUMENTS

JP   2004-040500   2/2004

* cited by examiner

*Primary Examiner* — Patricia Nguyen
(74) *Attorney, Agent, or Firm* — McDermott Will & Emery LLP

(57) ABSTRACT

A bias circuit 12 includes: a transistor Q5 operable to supply, to an amplifier 11, a bias current in accordance with a base current supplied thereto; a transistor Q3 operable to pass a current in accordance with a reference voltage Vref; a transistor Q2 operable to correct, in accordance with the current passed by the transistor Q3, the base current to be supplied to the transistor Q5, so as to compensate a temperature characteristic represented by the transistor Q5; and a bias changing section (of a transistor Q4, and resistances R5, R6, and R7), connected to a base of the transistor Q5, operable to change, in accordance with a control voltage VSW, an amount of the base current to be supplied to the transistor Q5. The amplifier 11 amplifies, by using the bias current supplied by the bias circuit 12, a radio frequency signal having been inputted thereto.

21 Claims, 21 Drawing Sheets

F I G. 1 5
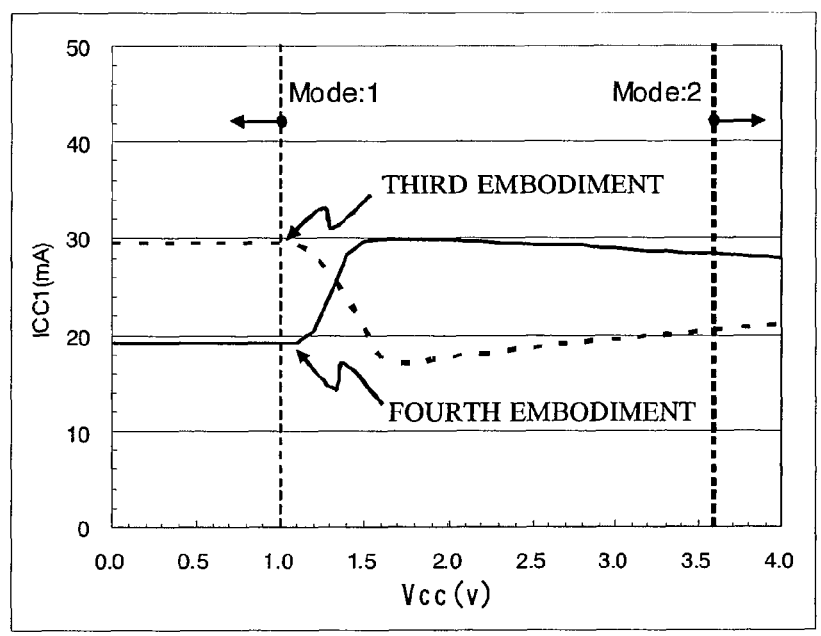

F I G. 1 8
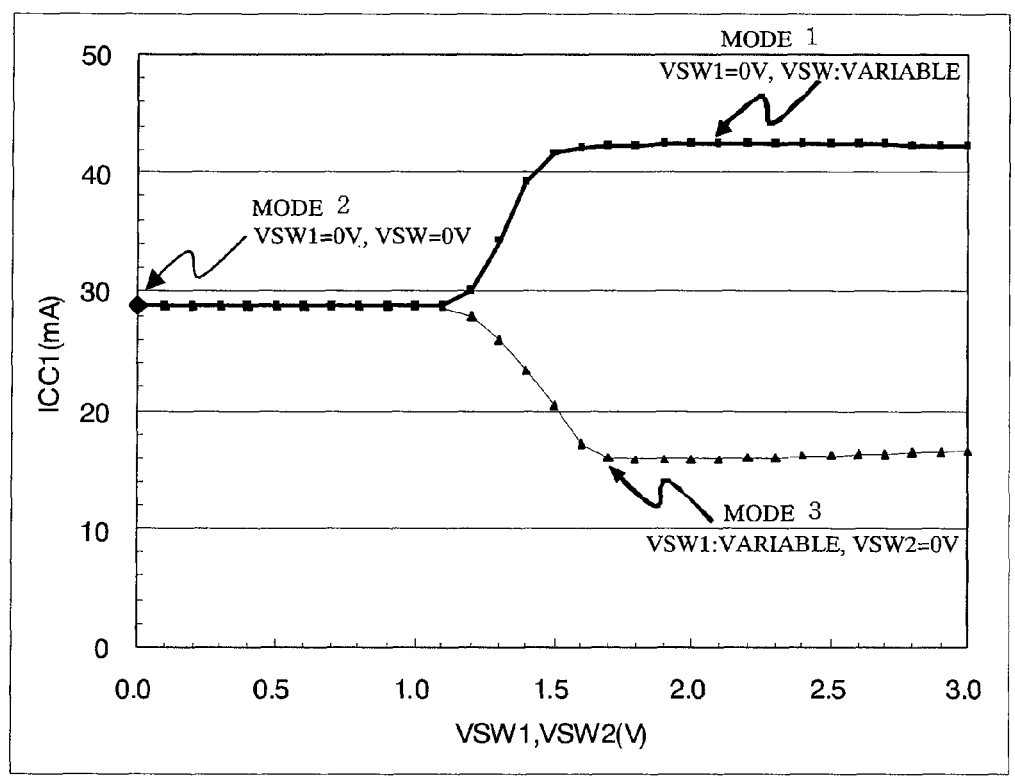

RADIO FREQUENCY AMPLIFIER CIRCUIT AND MOBILE COMMUNICATION TERMINAL USING THE SAME

This application is a Divisional of application Ser. No. 11/808,157 that was filed on Jun. 7, 2007 now U.S. Pat. No. 7,639,080, which in turn claims the benefit of Japanese Application No. 2006-158452, filed Jun. 7, 2006, the disclosures of which Applications are incorporated by reference herein in their entirety.

BACKGROUND OF THE INVENTION

1. Field of the Invention

The present invention relates to a radio frequency amplifier circuit for amplifying a radio frequency signal used by a transmission section of a mobile communication terminal such as a mobile telephone, and a mobile communication terminal using the radio frequency amplifier circuit, and more particularly, to a technique of controlling a bias current (output power) of the radio frequency amplifier circuit by using a control signal.

2. Description of the Background Art

Recently, in a mobile communication field, not only sound communication function but also data communication function of distributing an image and music has been developed. Therefore, a mobile communication terminal having an enhanced data communication function becomes predominant. For example, as the W-CDMA (Wideband Code Division Multiple Access) system, the HSDPA (High Speed Downlink Packet Access) system and the HSUPA (High Speed Uplink Packet Access) system have been developed so as to increasingly enhance a speed at which data are transmitted between a base station and the mobile communication terminal. Further, a multimode communication system in which the sound communication is performed by using the conventional W-CDMA system (Release99), and a high speed data communication is performed by using the HSDPA system and the HSUPA system, has been developed.

For example, the multimode mobile communication terminal as described above requires a radio frequency amplifier circuit to represent an enhanced linear characteristic in the HSDPA system used for the high speed data communication as compared to in the conventional Release99 used for the sound communication. In general, it is necessary to increase an operating current of the radio frequency amplifier circuit representing the enhanced linear characteristic. Therefore, the mobile communication terminal applicable to multiple communication systems is required to include a radio frequency amplifier circuit designed for the HSDPA system used for the high speed data communication so as to represent the enhanced linear characteristic. Therefore, consumption of current is increased in a normal mode used for the sound communication which is more frequently used than the high speed data communication. Further, diversified applications of the mobile communication terminal complicates a processing circuit, thereby increasing the consumption of current. Therefore, it is important to reduce the consumption of current in the radio frequency circuit block.

Hereinafter, a conventional mobile telephone terminal applicable to multiple communication systems used in the W-CDMA system will be described.

FIG. 23 is a block diagram illustrating a configuration of a radio communication section of the conventional mobile telephone terminal. As shown in FIG. 23, the radio communication section of the conventional mobile telephone terminal includes: a transmission section 200; a reception section 400; a synthesizer section 300; and a common use unit 500. The transmission section 200 includes: a modulator 201; a radio frequency amplifier circuit 202; a band-pass filter 203; a high power radio frequency amplifier circuit 204; and an isolator 205. The common use unit 500 includes an antenna 501 and a duplexer 502. The reception section 400 includes a radio frequency amplifier circuit 401, band-pass filters 402 and 404, and a demodulator 403. The synthesizer section 300 includes a temperature-controlled crystal oscillator (TCXO) 301, a phase-locked loop (PLL) circuit 302, and a voltage-controlled oscillator (VCO) 303.

The modulator 201 converts an inputted modulation signal into a transmission signal of a transmission frequency (around 1.9 GHz in the case of the W-CDMA system) by using a signal outputted by the synthesizer section 300. The radio frequency amplifier circuit 202 amplifies an output signal of the modulator 201 by changing a gain such that the output signal of the amplifier 201 changes from 1 mW or less up to a maximum of about 10 mW. The band-pass filter 203 extracts a signal of a transmission band from a radio frequency signal having been amplified by the radio frequency amplifier circuit 202. The high power radio frequency amplifier circuit 204 amplifies, by using a fixed gain, the radio frequency signal outputted by the band-pass filter 203 such that the radio frequency signal changes from 10 mW or less up to a maximum of about 1 W. The isolator 205 unidirectionally supplies an output signal of the high power radio frequency amplifier circuit 204 to the common use unit 500.

The duplexer 502 includes a TX terminal connected to an output terminal of the isolator 205, an RX terminal connected to an input terminal of the reception section 400, and an ANT terminal connected to the antenna 501. The radio frequency amplifier circuit 401 amplifies a signal received by the antenna 501 of the common use unit 500. The band-pass filter 402 extracts a signal of a transmission band from an output signal of the radio frequency amplifier circuit 401. The demodulator 403 mixes the signal extracted by the band-pass filter 402 and a local signal supplied by the synthesizer section 300. The band-pass filter 404 extracts an intermediate frequency signal from an output signal of the demodulator 403. The synthesizer section 300 supplies, to the transmission section 200 and the reception section 400, a signal of a predetermined frequency.

Next, the high power radio frequency amplifier circuit for use in a radio frequency circuit block of the mobile communication terminal will be described.

In recent years, the high power radio frequency amplifier circuit for use in a radio frequency circuit block of the mobile communication terminal uses a heterojunction bipolar transistor (HBT) instead of an field effect transistor (FET). Unlike the depression type FET, the HBT does not require a negative voltage for a gate bias, and is capable of performing amplification using only power supply of a positive voltage, thereby simplifying a peripheral circuit. However, the HBT is disadvantageous in that the HBT requires a bias circuit for compensating temperature dependency and power supply voltage dependency. Accordingly, it is important to design the bias circuit so as to represent stable characteristic.

Hereinafter, the conventional radio frequency amplifier circuit will be described with reference to drawings.

For example, an amplifier 100 as shown in FIG. 24 typifies the conventional radio frequency amplifier circuit. See, for example, Japanese Laid-Open Patent Publication No. 2004-40500 (page 7, FIG. 1). In FIG. 24, the amplifier 100 includes a bias circuit 102, a reference voltage supply section 103, and a transistor Q101. The bias circuit 102 includes: a resistance R102; a resistance R103; a transistor Q102; a transistor Q103;

and a transistor Q104. The reference voltage supply section 103 includes a resistance R101.

To the resistance R102, a switchover voltage Vmod for switching a set bias is applied at one terminal thereof, and a collector and a base of the transistor Q102 are connected at the other terminal thereof. An emitter of the transistor Q102 is connected to a collector and a base of the transistor Q103. An emitter of the transistor Q103 is grounded. A power supply voltage Vdc is applied to a collector of the transistor Q104, and an emitter of the transistor Q104 is grounded via the resistance R103 and receives a reference voltage Vref applied thereto via the resistance R101. The transistor Q104 receives, at a base thereof, a voltage from the other terminal of the resistance R102, and outputs the voltage from its emitter. The output from the emitter of the transistor Q104 is inputted to a base of the transistor Q101.

The amplifier 100 changes the switchover voltage Vmod so as to change a base bias, thereby controlling operation of the transistor Q101. Specifically, when high power output operation is performed, the amplifier 100 sets the switchover voltage Vmod as 3V so as to allow the bias circuit 102 to supply a base bias to the transistor Q101. On the other hand, when low power output operation is performed, the amplifier 100 sets the switchover voltage Vmod as 0V so as not to allow the bias circuit 102 to supply a base bias to the transistor Q101. The base bias of the transistor Q101 is the reference voltage Vref which is supplied via the resistance R101. The circuit configuration as described above allows the amplifier 100 to perform the changeover operation.

However, the conventional radio frequency amplifier circuit as described above has the following problems.

The first problem is that it is necessary to provide a high precision power supply for the power supply voltage Vdc and a high precision power supply for the reference voltage Vref.

The reason for providing the high precision power supplies is as follows. When the amplifier 100 performs high power output and a value of the reference voltage Vref is changed, a current flowing from the transistor Q104 corresponding to a base current for the transistor Q101 is changed, thereby significantly changing an operating current of the transistor Q101. On the other hand, when the amplifier 100 performs low power output and a value of the power supply voltage Vdc is changed, a base current for the transistor Q101 is changed, thereby significantly changing an operating current of the transistor Q101. Further, it is necessary to provide power supplies regulated by a voltage circuit for the switchover voltage Vmod and the power supply voltage Vdc, thereby increasing a circuit scale.

The second problem is that the amplifier 100 capable of changing between the high power output operation and the low power output operation requires an increased circuit scale.

The reason for increasing the circuit scale is as follows. When a control logic of the mobile communication terminal for changing between the high power output operation and the low power output operation is different from that of the amplifier 100 (the high power output operation: reference voltage Vref=2.7V, and the low power output operation: reference voltage Vref=0V), it is necessary to add, to a control circuit, a logic circuit for reversing a control signal, thereby increasing the circuit scale.

The third problem is that a power gain of the radio frequency amplifier circuit is different between when the amplifier 100 performs the high power output operation and when the amplifier 100 performs the low power output operation.

The reason the power gain is changed is as follows. A current flowing through the collector of the transistor Q101 is different between the high power output operation and the low power output operation. In general, in the radio frequency amplifier circuit using a transistor, increase in operating current leads to increase in power gain. Therefore, the power gain changes for each operation, and therefore a control parameter is required to have the increased number of values in the radio frequency circuit block of the mobile communication terminal, thereby complicating the control circuit.

SUMMARY OF THE INVENTION

Therefore, an object of the present invention is to provide a radio frequency amplifier circuit which allows increase of a setting range in which a control voltage is set for a bias current, allows a bias circuit for controlling the bias current to be configured with enhanced flexibility, and is applicable to multiple communication systems in a simple and reduced-scale configuration, and a mobile communication terminal using the radio frequency amplifier circuit.

The present invention is directed to a radio frequency amplifier circuit for amplifying a radio frequency signal. In order to attain the object mentioned above, the radio frequency amplifier circuit according to the present invention comprises: a bias circuit operable to generate a bias current, in which an amount of the bias current is changeable in accordance with a control signal; and an amplifier operable to amplify, by using the bias current supplied by the bias circuit, the radio frequency signal having been inputted thereto.

Typically, the bias circuit includes: a bias supply transistor operable to supply, to the amplifier, the bias current in accordance with a base current supplied thereto; a first temperature compensation transistor operable to pass a current in accordance with a reference voltage; a second temperature compensation transistor operable to correct, in accordance with the current passed by the first temperature compensation transistor, the base current to be supplied to the bias supply transistor, so as to compensate a temperature characteristic represented by the bias supply transistor; and a bias changing section, connected to either a base of the bias supply transistor (configuration 1) or a base of the second temperature compensation transistor (configuration 2), operable to change, in accordance with the control signal, an amount of the base current to be supplied to the bias supply transistor.

Further, the configuration (configuration 3) may be such that a second bias circuit operable to generate a second bias current, in which an amount of the second bias current is changeable in accordance with the control signal, and a second amplifier operable to amplify, by using the second bias current supplied by the second bias circuit, the radio frequency signal having been amplified by the amplifier, are further provided, and the bias current and the second bias current have values which change so as to be inversely proportional to each other.

In this case, the bias circuit includes a bias supply transistor operable to supply, to the amplifier, the bias current in accordance with a base current supplied thereto, and the second bias circuit includes a bias supply transistor operable to supply, to the second amplifier, the second bias current in accordance with a base current supplied thereto, and each of the bias circuit and the second bias circuit includes: a first temperature compensation transistor operable to pass a current in accordance with a reference voltage; and a second temperature compensation transistor operable to correct, in accordance with the current passed by the first temperature compensation transistor, the base current to be supplied to the bias supply transistor, so as to compensate a temperature characteristic represented by the bias supply transistor, and one of the bias circuit and the second bias circuit includes a bias changing section, connected to a base of the bias supply transistor, operable to change, in accordance with the control signal, an amount of the base current to be supplied to the bias supply transistor, and the other of the bias circuit and the second bias circuit includes a bias changing section, connected to a base of the second temperature compensation transistor, operable to change, in accordance with the control signal, an amount of the base current to be supplied to the bias supply transistor.

The control signal is a control voltage applied from outside or the control signal is a power supply voltage applied to the amplifier.

The bias changing section of each of the configurations 1 to 3 includes: a bias changing transistor having a base to which the control voltage is applied or a voltage is applied in accordance with the power supply voltage; and a resistance connected to at least one of a collector and an emitter of the bias changing transistor; and it is preferable that the bias changing section of each of the configurations 1 and 3 reduces, when the bias changing transistor functions, the amount of the base current to be supplied to the bias supply transistor, and the bias changing section of the configuration 2 increases, when the bias changing transistor functions, the amount of the base current to be supplied to the bias supply transistor. Further, when the control signal is the power supply voltage, a second bias changing transistor having a base to which the reference voltage is applied, a collector to which the power supply voltage is applied, and an emitter connected to the base of the bias changing transistor, may be provided in the bias changing section.

Further, it is preferable that a voltage between a base and an emitter of a transistor used in the bias circuit is substantially equal to a voltage between a base and an emitter of a transistor used in the amplifier.

Moreover, the bias changing transistor may be a field-effect transistor. Further, the control signal and the radio frequency signal are inputted from a same terminal.

The radio frequency amplifier circuit described above is applicable to a mobile communication terminal comprising a radio frequency circuit block which includes a synthesizer section, a transmission section, a reception section, a common use unit, and a control signal output section. In this case, the transmission section includes a modulator operable to convert an inputted modulation signal into a transmission signal of a predetermined transmission frequency; a radio frequency amplifier circuit, capable of changing a gain, operable to amplify the transmission signal obtained by conversion performed by the modulator; a band-pass filter operable to extract a signal of a predetermined band from the transmission signal having been amplified by the radio frequency amplifier circuit; the radio frequency amplifier circuit operable to amplify, using a fixed gain, the signal extracted by the band-pass filter; an isolator, provided between the common use unit and the radio frequency amplifier circuit using the fixed gain, operable to unidirectionally pass a signal to the common use unit from the radio frequency amplifier circuit using the fixed gain, and the radio frequency amplifier circuit described above is used as the radio frequency amplifier circuit of the transmission section using the fixed gain.

According to the present invention, the control voltage which has values changing within an increased setting range of values is used so as to change a current flowing through the bias circuit, thereby controlling the bias current of the amplifier. Thus, it is unnecessary to provide a high precision A/D converter, thereby reducing the circuit scale of the radio frequency circuit block. Further, the configuration of the bias circuit is partially changed in accordance with the control logic for switching between the high power output operation and the low power output operation, and therefore the control signal can be reversed without addition of a logic circuit, thereby reducing the circuit scale of the radio frequency circuit block. Moreover, the increased number of amplifiers are connected to each other such that, when the power gain is increased by controlling the bias current of the amplifier, the bias circuits supply, to the respective corresponding amplifiers, the bias currents which change so as to be inversely proportional to each other. Therefore, the change of the power gain in accordance with the control voltage can be suppressed.

These and other objects, features, aspects and advantages of the present invention will become more apparent from the following detailed description of the present invention when taken in conjunction with the accompanying drawings.

BRIEF DESCRIPTION OF THE DRAWINGS

FIG. 15 is a diagram illustrating an example of radio frequency characteristic represented by the radio frequency amplifier circuit 40;

FIG. 18 is a diagram illustrating an example of radio frequency characteristic represented by the radio frequency amplifier circuit 50;

DESCRIPTION OF THE PREFERRED EMBODIMENTS

Hereinafter, embodiments of the present invention will be described with reference to the drawings.

First Embodiment

Figure 1:
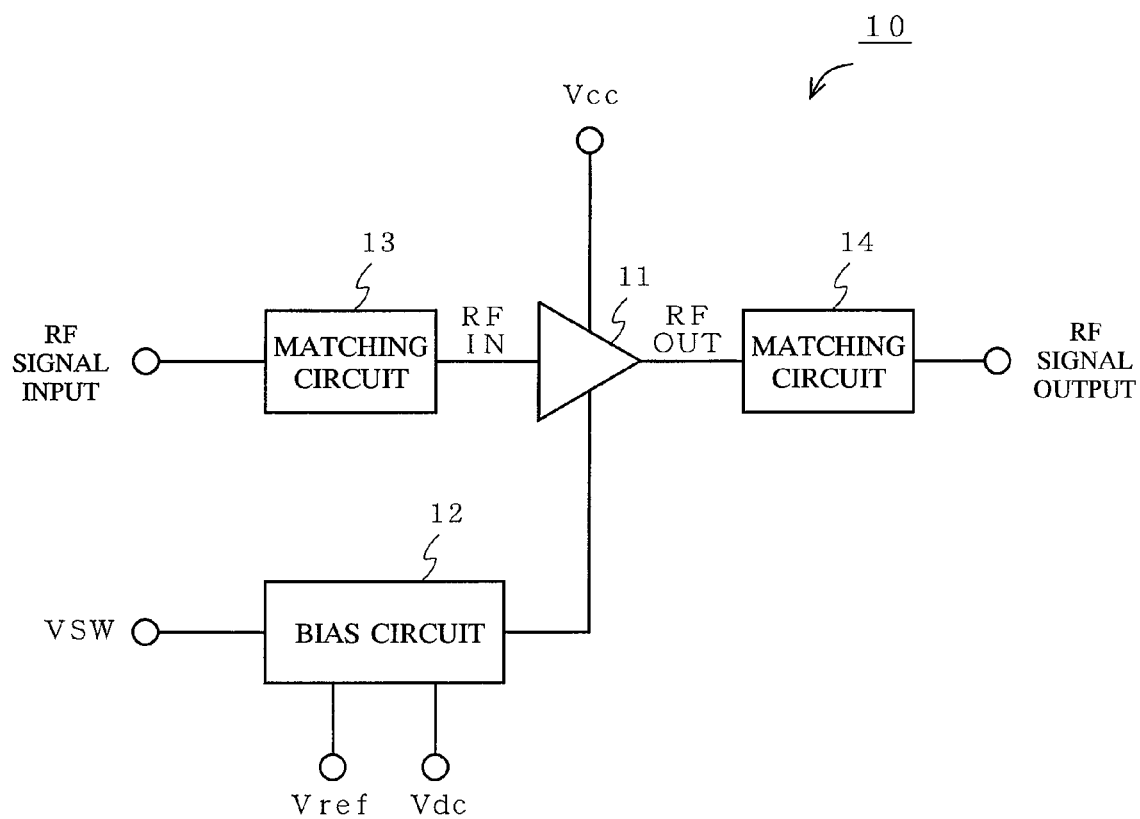
FIG. 1 is a diagram illustrating a configuration of a radio frequency amplifier circuit 10 according to a first embodiment of the present invention.
Figure 2:
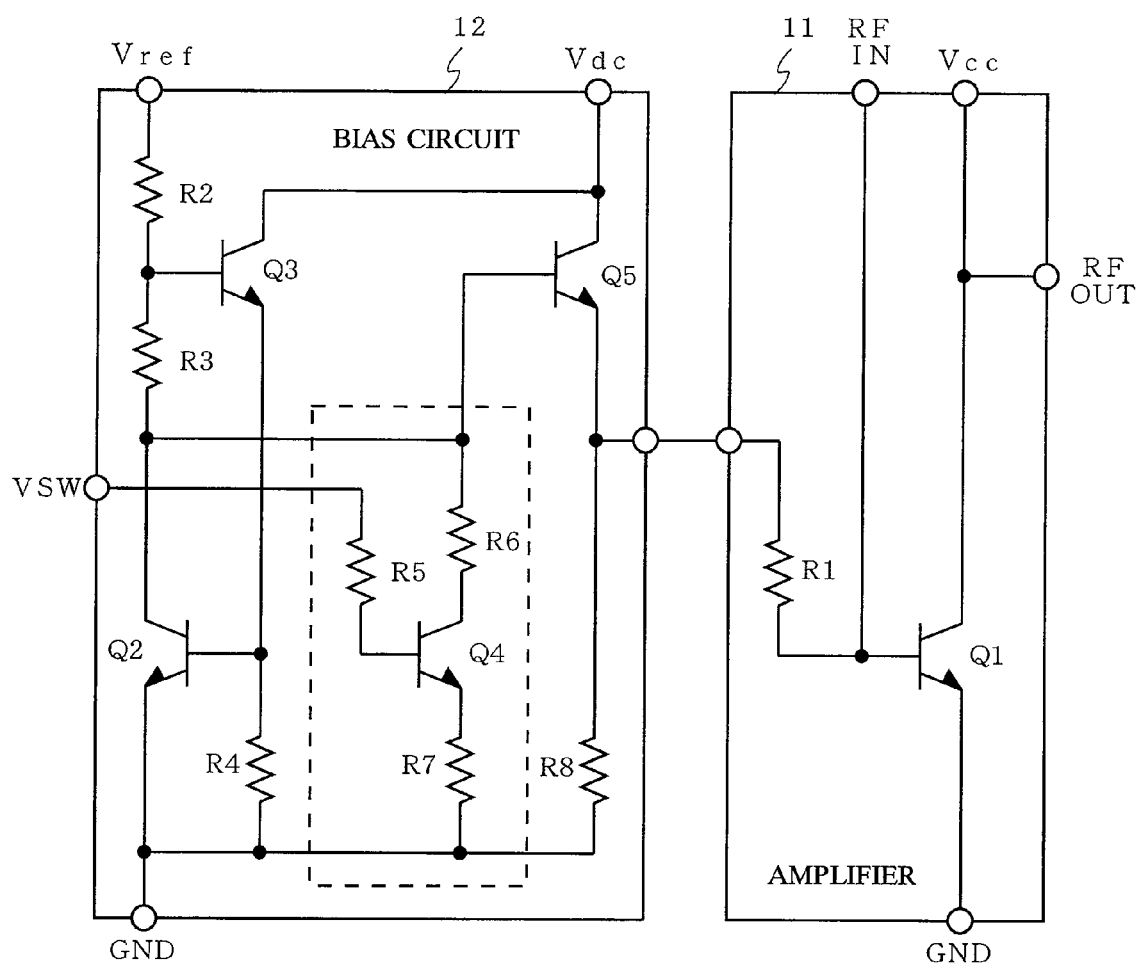
FIG. 2 is a diagram illustrating in detail a circuit configuration of the radio frequency amplifier circuit 10.
Figure 3:
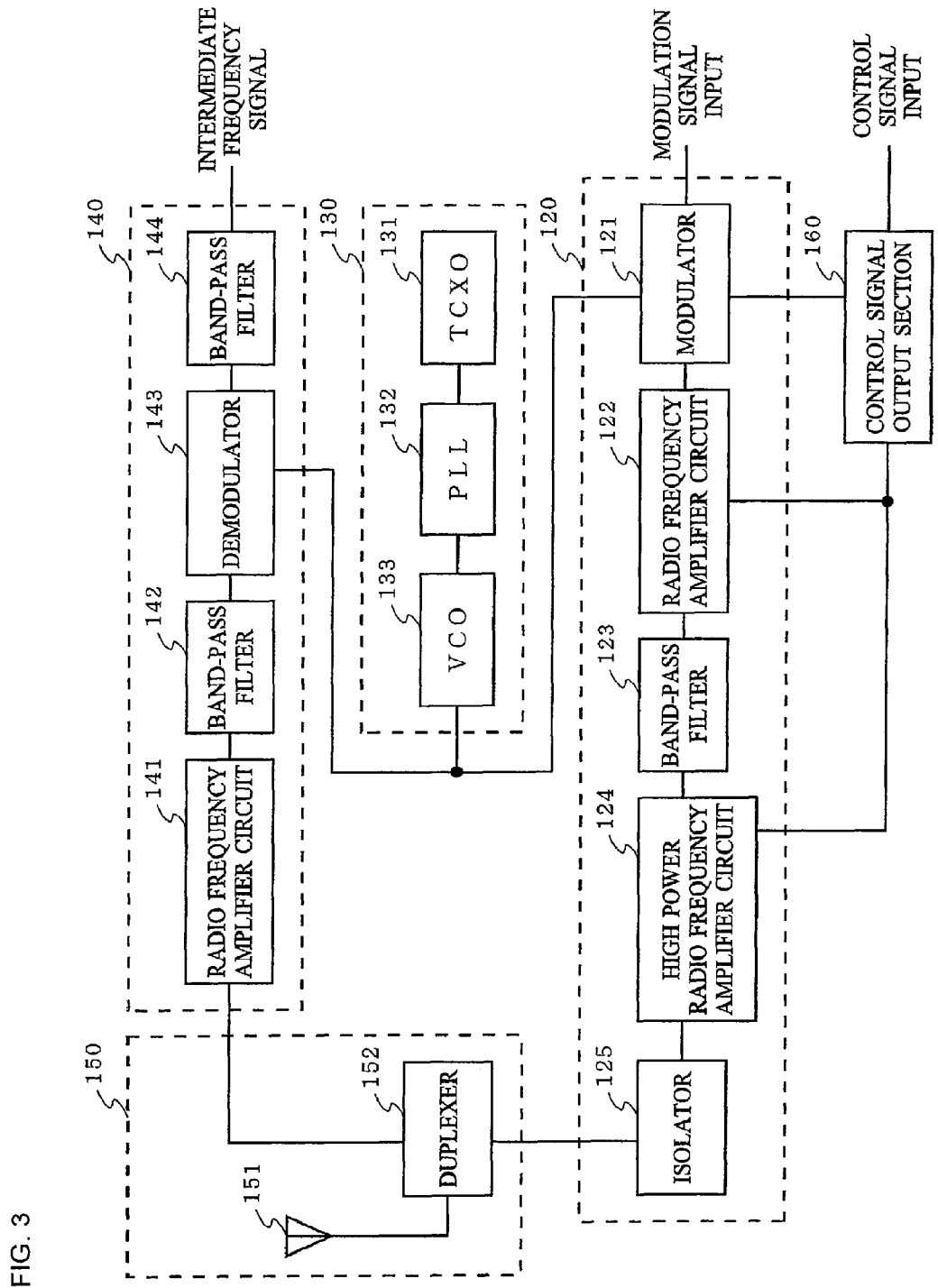
FIG. 3 is a diagram illustrating a configuration of a radio communication section of a mobile telephone terminal including the radio frequency amplifier circuit 10.

FIG. 1 is a block diagram illustrating a configuration of a radio frequency amplifier circuit 10 according to a first embodiment of the present invention. FIG. 2 is a diagram illustrating in detail a circuit configuration of an amplifier 11 and a bias circuit 12 of the radio frequency amplifier circuit 10. FIG. 3 is a block diagram illustrating a configuration of a radio communication section of a mobile telephone terminal including the radio frequency amplifier circuit 10.

Firstly, the radio communication section of the mobile telephone terminal shown in FIG. 3 will be described in detail. Thereafter, the radio frequency amplifier circuit 10 will be described in detail. The mobile telephone terminal according to the present embodiment is applicable to multiple communication systems of the W-CDMA system.

As shown in FIG. 3, the radio communication section of the mobile telephone terminal includes: a transmission section 120; a reception section 140; a synthesizer section 130; a common use unit 150, and a control signal output section 160. The transmission section 120 includes: a modulator 121; a radio frequency amplifier circuit 122; a band-pass filter 123; a high power radio frequency amplifier circuit 124; and an isolator 125. The common use unit 150 includes an antenna 151 and a duplexer 152. The reception section 140 includes a radio frequency amplifier circuit 141, a band-pass filters 142 and 144, and a demodulator 143. The synthesizer section 130 includes a temperature-controlled crystal oscillator (TCXO) 131, a phase-locked loop (PLL) circuit 132, and a voltage-controlled oscillator (VCO) 133.

The modulator 121 converts an inputted modulation signal into a transmission signal of a transmission frequency (around 1.9 GHz in the case of the W-CDMA system) by using a signal outputted by the synthesizer section 130. The radio frequency amplifier circuit 122 amplifies an output signal of the modulator 121 by changing a gain such that the output signal of the modulator 121 changes from 1 mW or less up to a maximum of about 10 mW. The band-pass filter 123 extracts a signal of a transmission band from a radio frequency signal having been amplified by the radio frequency amplifier circuit 122. The high power radio frequency amplifier circuit 124 amplifies, by using a fixed gain, the radio frequency signal outputted by the band-pass filter 123 such that the radio frequency signal changes from 10 mW or less up to a maximum of about 1 W. The radio frequency amplifier circuit 10 according to the first embodiment of the present invention is used as the high power radio frequency amplifier circuit 124.

Further, the modulator 121, the radio frequency amplifier circuit 122, and the high power radio frequency amplifier circuit 124 function so as to switch among a plurality of operation modes. For example, radio communication specifications of the radio frequency amplifier circuit are different between the W-CDMA system (Release99) and the HSDPA system. Therefore, a function is switched in accordance with a corresponding system so as to realize a plurality of operation modes. The isolator 125 unidirectionally supplies an output signal of the high power radio frequency amplifier circuit 124 to the common use unit 150.

The duplexer 152 includes a TX terminal connected to an output terminal of the isolator 125, an RX terminal connected to an input terminal of the reception section 140, and an ANT terminal connected to the antenna 151. The radio frequency amplifier circuit 141 amplifies a signal received by the antenna 151 of the common use unit 150. The band-pass filter 142 extracts a signal of a transmission band from an output signal of the radio frequency amplifier circuit 141. The demodulator 143 mixes the signal extracted by the band-pass filter 142 and a local signal supplied by the synthesizer section 130. The band-pass filter 144 extracts an intermediate frequency signal from an output signal of the demodulator 143. The synthesizer section 130 supplies, to the transmission section 120 and the reception section 140, a signal of a predetermined frequency. The control signal output section 160 controls, in accordance with an inputted control signal, mode switchover performed by the modulator 121, the radio frequency amplifier circuit 122, and the high power radio frequency amplifier circuit 124.

Next, a configuration and an operation of the radio frequency amplifier circuit 10 will be described in detail with reference to FIGS. 1 and 2.

As shown in FIG. 1, the radio frequency amplifier circuit 10 includes the amplifier 11, the bias circuit 12, a matching circuit 13, and a matching circuit 14. Each of the matching circuit 13 and the matching circuit 14 is an impedance matching circuit for subjecting an input signal to impedance conversion. The bias circuit 12 changes, based on a control signal for controlling a bias current of the radio frequency amplifier circuit 10, a bias current to be supplied to the amplifier 11. According to the present embodiment, a control voltage VSW generated in an external circuit is used as the control signal. The amplifier 11 amplifies, in accordance with the bias current supplied by the bias circuit 12, a radio frequency signal inputted via the matching circuit 13, and outputs, via the matching circuit 14, the radio frequency signal having been amplified. Thus, a level of the signal outputted by the amplifier 11 can be changed.

As shown in FIG. 2, the amplifier 11 includes a resistance R1 and a transistor Q1. The bias circuit 12 includes resistances R2, R3, R4, R5, R6, R7, and R8, and transistors Q2, Q3, Q4, and Q5. The transistor Q1 is used for amplification, the transistor Q2 and the transistor Q3 for temperature compensation, the transistor Q4 for changing a bias, and the transistor Q5 for supplying the bias. The transistor Q4, and the resistances R5, R6, and R7 form a bias changing section (as shown by dotted lines in FIG. 2).

To the resistance R2, a reference voltage Vref is applied at one terminal thereof, and a base of the transistor Q3 and one terminal of the resistance R3 are connected at the other terminal thereof. The other terminal of the resistance R3 is connected to a collector of the transistor Q2. An emitter of the transistor Q2 is grounded, and a base of the transistor Q2 is connected to an emitter of the transistor Q3 and one terminal of the resistance R4. The other terminal of the resistance R4 is grounded. The control voltage VSW is applied to a base of the transistor Q4 via the resistance R5. A collector of the transistor Q4 is connected to the collector of the transistor Q2 and a base of the transistor Q5 via the resistance R6, and an emitter of the transistor Q4 is grounded via the resistance R7. An emitter of the transistor Q5 is grounded via the resistance R8, and is connected to a base of the transistor Q1 via the resistance R1. A power supply voltage Vdc is applied to the collectors of the transistor Q3 and the transistor Q5. The transistor Q1 receives a radio frequency signal (RFIN) at the base, and amplifies the received radio frequency signal so as to output, from the collector, the radio frequency signal (RFOUT) having been amplified.

Firstly, when each of the reference voltage Vref, the power supply voltage Vdc, and the power supply voltage Vcc is set so as to have a predetermined value, and the control voltage VSW is 0V (operation mode 1), the radio frequency amplifier circuit operates as follows.

An apply voltage (about 1.3V) between the base and the emitter of each of the transistors Q2, Q3, and Q5 is higher than a turn-on voltage, and therefore the transistors Q2, Q3, and Q5 are ON. As a result, the transistor Q1 operates. A voltage between the base and the emitter of the transistor Q4 is 0V, so that the transistor Q4 is OFF. When the transistor Q4 is OFF, a circuit formed by the transistor Q4, the resistance R7, and the resistance R6, all of which are connected to the base of the transistor Q5, does not function. Further, a current based on the reference voltage Vref flows through the transistor Q3. The transistor Q2 corrects, based on the current flowing through the transistor Q3, a bias current to be supplied from the transistor Q5 to the transistor Q1, so as to compensate temperature characteristic. A collector current of the transistor Q1 is determined based on an emitter current of the transistor Q5, and the emitter current is determined mainly based on a value of the resistance R2. Further, when a value of the reference voltage Vref is likely to vary, the resistance R3 is set, in accordance with the value varying, so as to have such a value as to prevent change of the emitter current of the transistor Q5.

Next, when each of the reference voltage Vref, the power supply voltage Vdc, and the power supply voltage Vcc is set so as to have a predetermined value and the control voltage VSW is 3V (operation mode 2), the radio frequency amplifier circuit operates as follows.

The operations performed by the transistors Q2, Q3, and Q5 are the same as those performed in the operation mode 1 described above. In the operation mode 2, an apply voltage between the base and the emitter of the transistor Q4 is 3V, so that the transistor Q4 is ON. The circuit formed by the transistor Q4, the resistance R7 and the resistance R6, all of which are connected to the base of the transistor Q5, functions, so that a portion of current to be supplied to the base of the transistor Q5 flows through the bias changing section corresponding to the circuit formed by the resistance R6, the resistance R7, and the transistor Q4. Consequently, the current supplied to the base of the transistor Q5 is reduced as compared to that supplied in the operation mode 1, thereby reducing an operating current of the transistor Q1.

As described above, the control voltage VSW of the bias circuit 12 has its value changed so as to control an amount of base current of the transistor Q5, that is, an amount of bias current of the transistor Q1.

Figure 4:
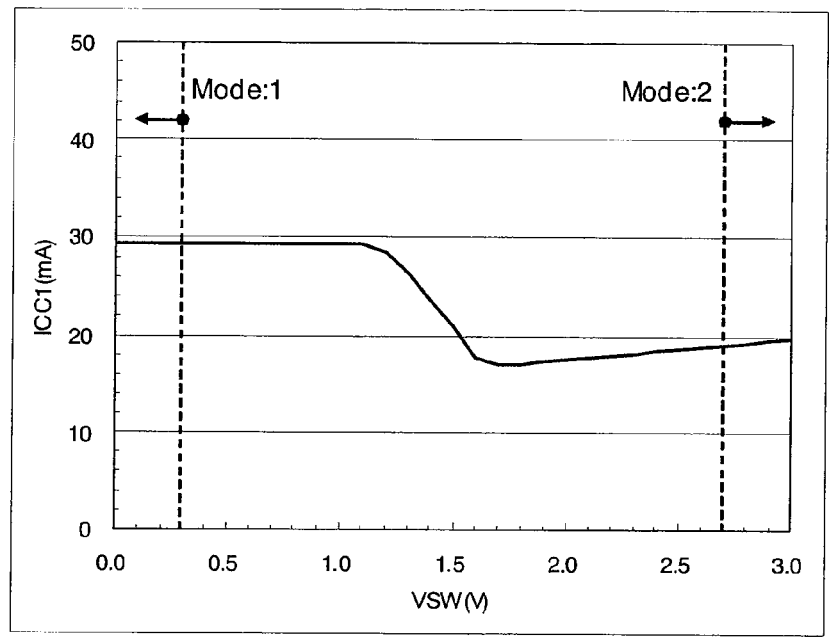
FIGS. 4 through 7 are diagrams each illustrating an example of radio frequency characteristic represented by the radio frequency amplifier circuit 10.

FIG. 4 is a diagram illustrating a relationship between the control voltage VSW applied to the radio frequency amplifier circuit 10 and a current flowing through a collector of an amplifying transistor. FIG. 4 indicates that the current flowing through the collector of the amplifying transistor changes in accordance with the control voltage VSW.

Next, the two operation modes for the radio frequency amplifier circuit 10 will be described in detail. A mode in which the radio frequency amplifier circuit 10 operates when the control voltage VSW is 0V is defined as the operation mode 1, in which the bias current of the transistor Q1 is 30 mA. A mode in which the radio frequency amplifier circuit 10 operates when the control voltage VSW is 3V is defined as the operation mode 2, in which the operating current of the transistor Q1 is 20 mA. Further, FIG. 4 indicates that the current has its values changing against a portion of values of the control voltage VSW, and the current has an almost constant value with respect to another portion of the values of the control voltage VSW. Thus, it is possible to set the control voltage VSW so as to have a value within an increased range.

Figure 5:
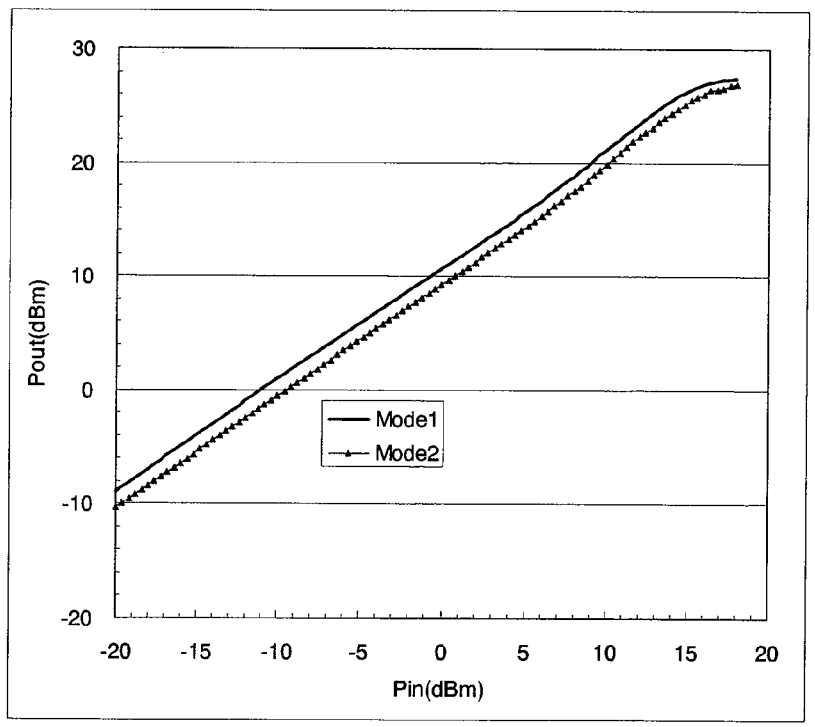
Figure 6:
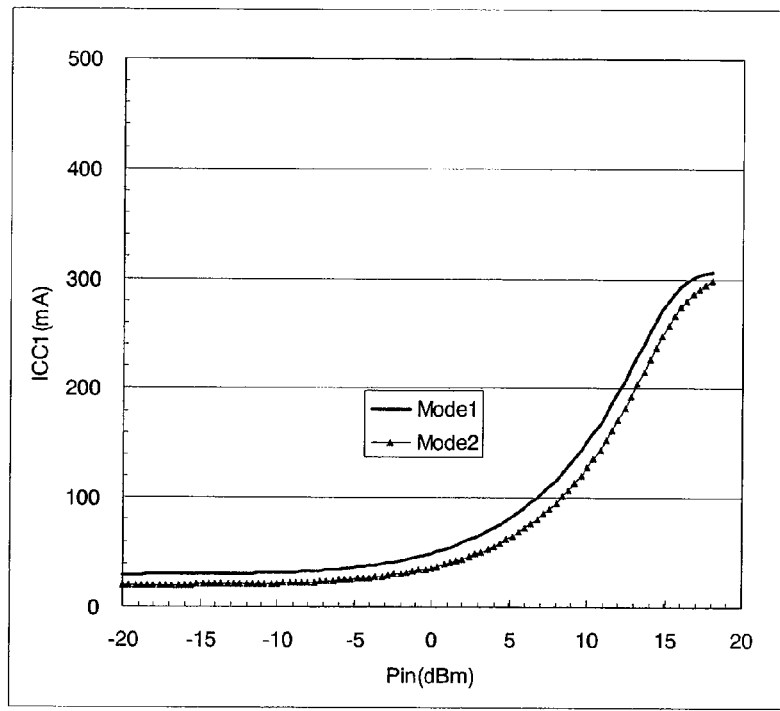
Figure 7:
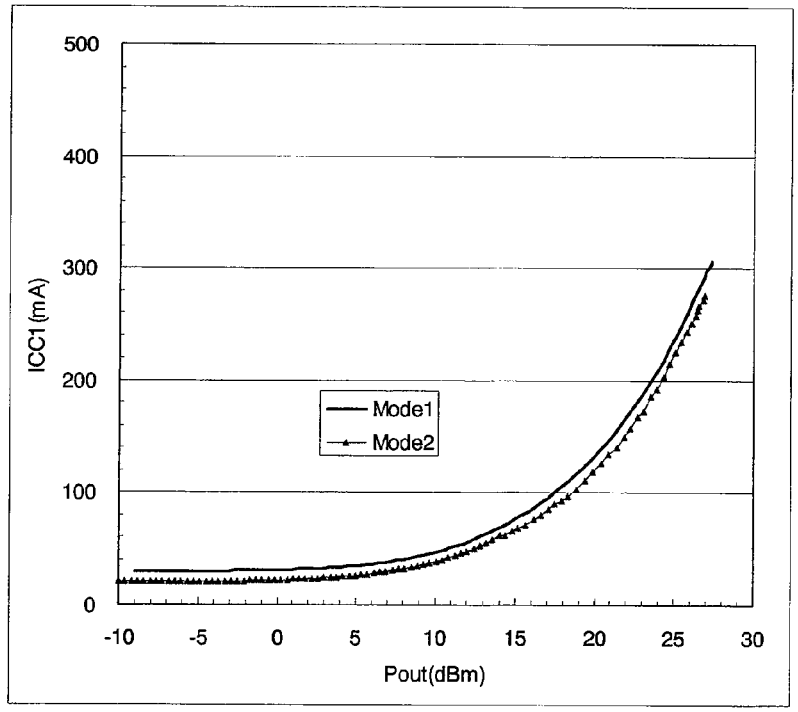

FIG. 5 is a diagram illustrating a relationship between input power and output power of the radio frequency signal of the radio frequency amplifier circuit 10. FIG. 6 is a diagram illustrating a relationship between the power of the radio frequency signal inputted to the radio frequency amplifier circuit 10 and the current flowing through the collector of the amplifying transistor. FIG. 7 is a diagram illustrating a relationship between the power of the radio frequency signal outputted by the radio frequency amplifier circuit 10 and the current flowing through the collector of the amplifying transistor. Each of FIGS. 5 to 7 also shows power characteristics of each of the operation mode 1 and the operation mode 2.

In general, the bias current of the radio frequency amplifier circuit is increased so as to enhance the linear characteristic represented by the radio frequency amplifier circuit. The operating current flowing through the radio frequency amplifier circuit 10 is increased in the operation mode 1 as compared to in the operation mode 2. In other words, it is possible to enhance the linear characteristic in the operation mode 1 as compared to in the operation mode 2.

Here, an example where the power supply voltages are set will be described. The reference voltage Vref is set as 2.8V, and each of the power supply voltages Vdc and Vcc is set as 3.6V. Further, the control voltage VSW (0V/3V) is applied as an output voltage of a logic circuit, so that it is unnecessary to use a high precision A/D converter for a power supply for the control voltage VSW.

Next, an exemplary setting range in which a value of each of the resistances R2, R3, R4, R5, R6, R7, and R8 is set will be described. The values of the resistances R2, R3, R4, R5, R6, R7, and R8 depend on a set value of the collector current of the transistor Q1, a size (dimensions) of the transistor Q1, and an epitaxial layer structure of the transistor Q1. The value of the resistance R2 is about 20Ω to 300Ω, and is typically about 100Ω. The value of the resistance R3 is about 500Ω to 1 kΩ. The value of the resistance R4 is about 1Ω to 3 kΩ. Each of values of the resistance R5 and the resistance R6 is about 1 kΩ to 10 kΩ. The value of the resistance R7 is about 100Ω to 2 kΩ. Further, the bias circuit may have the resistance R3 short-circuited such that the values of the respective resistances can be set, in a flexible manner, so as to obtain the characteristic to be desired or so as to correspond to the circuit scale. Further, another resistance may be provided so as to be connected to the emitter of the transistor Q3 at one terminal thereof and the base of the transistor Q2 at the other terminal thereof (this configuration is not shown), and, depending on a value of the another resistance, the values of the resistances R2, R3, and R4 are slightly changed.

As described above, the radio frequency amplifier circuit and the mobile communication terminal according to the first embodiment of the present invention allow a current of the bias circuit to be changed in accordance with the control voltage VSW which has values changing within an increased setting range of the values, thereby controlling the bias current of the amplifier. Thus, it is unnecessary to provide a high precision A/D converter, thereby reducing the circuit scale of the radio frequency circuit block.

Second Embodiment

Figure 8:
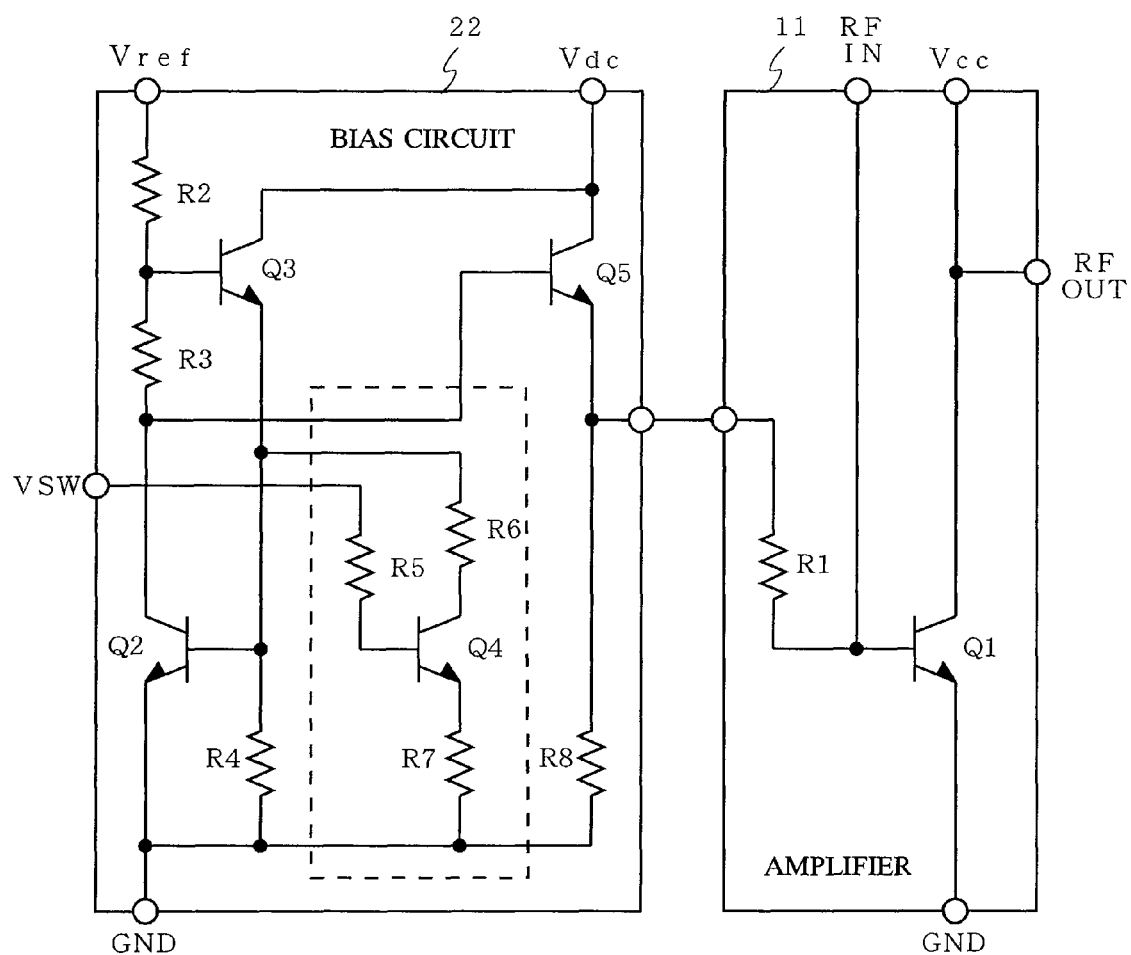
FIG. 8 is a diagram illustrating a configuration of a radio frequency amplifier circuit 20 according to a second embodiment of the present invention.

FIG. 8 is a diagram illustrating in detail a circuit configuration of the amplifier 11 and a bias circuit 22 of the radio frequency amplifier circuit 20 according to a second embodiment of the present invention. The radio frequency amplifier circuit 20 according to the second embodiment has the same configuration as the radio frequency amplifier circuit 10 according to the first embodiment except that the bias circuit 22 is used, in the radio frequency amplifier circuit 20, instead of the bias circuit 12. Therefore, FIG. 1 is also used as a block diagram illustrating the configuration of the radio frequency amplifier circuit 20, and a block diagram and description are not additionally provided for the radio frequency amplifier circuit 20. In the second embodiment, the radio frequency amplifier circuit 20 is used as the high power radio frequency amplifier circuit 124. Therefore, FIG. 3 is a block diagram also illustrating a configuration of a radio communication section of a mobile telephone terminal including the radio frequency amplifier circuit 20, and a block diagram and description are not additionally provided for the radio communication section of the second embodiment.

As shown in FIG. 8, the bias circuit 22 includes the resistances R2, R3, R4, R5, R6, R7, and R8, and the transistors Q2, Q3, Q4, and Q5. A configuration of those components are the same as that described for the bias circuit 12 with reference to FIG. 2 except that, in the bias circuit 22, the collector of the transistor Q4 is connected via the resistance R6 to the emitter of the transistor Q3 instead of the base of the transistor Q5.

Hereinafter, the operation performed by the bias circuit 22 having the configuration as described above will be described. The fundamental operation of the bias circuit 22 is the same as that of the bias circuit 12.

Firstly, when each of the reference voltage Vref, the power supply voltage Vdc, and the power supply voltage Vcc is set so as to have a predetermined value and the control voltage VSW is 0V (operation mode 1), a voltage between the base and the emitter of the transistor Q4 is 0V, so that the transistor Q4 is OFF. In this case, the base current of the transistor Q2 and the emitter current of the transistor Q2 depend on a value of the resistance R4.

Next, when each of the reference voltage Vref, the power supply voltage Vdc, and the power supply voltage Vcc is set so as to have a predetermined value and the control voltage VSW is 3V (operation mode 2), an apply voltage between the base and the emitter of the transistor Q4 is 3V, so that the transistor Q4 is ON. Therefore, configured is a circuit in which the resistance R4 via which the base of the transistor Q2 is grounded, and a resistance formed by serially connecting between the resistance R6 and the resistance R7, are connected in parallel with each other, so that a resistance value is reduced as compared to in the operation mode 1 in which the control voltage VSW is 0V, thereby reducing a base voltage of the transistor Q2. Therefore, the base current of the transistor Q2 is reduced, and a current flowing through the collector of the transistor Q2 is reduced, thereby increasing a current flowing through the base of the transistor Q5. Consequently, a current outputted from the emitter of the transistor Q5 is increased and the bias current supplied to the transistor Q1 of the amplifier 11 is increased.

Figure 9:
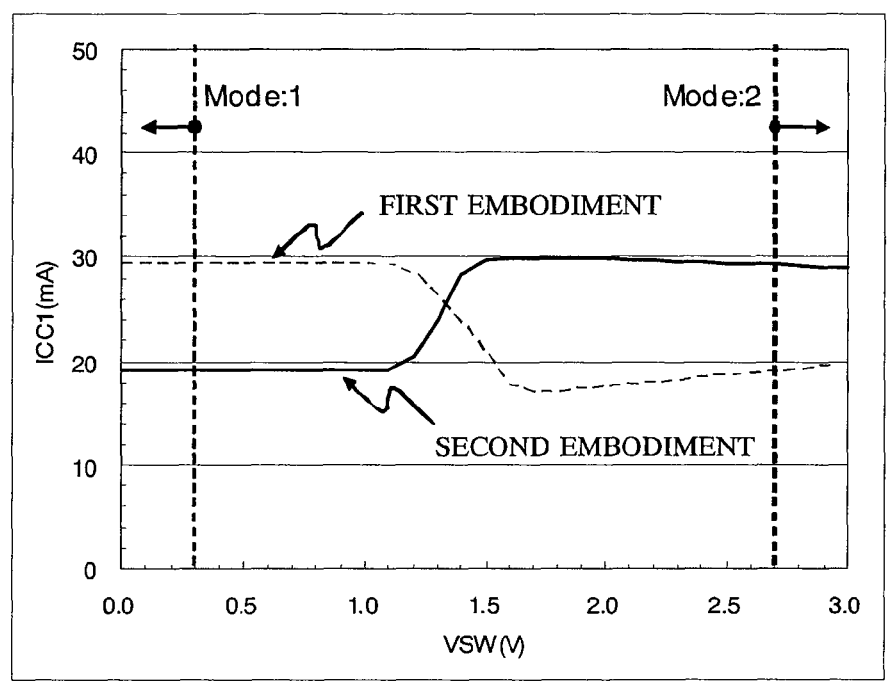
FIG. 9 is a diagram illustrating an example of radio frequency characteristic represented by the radio frequency amplifier circuit 20.

FIG. 9 is a diagram illustrating a relationship between the control voltage VSW applied to the radio frequency amplifier circuit 20 and the current flowing through the collector of the amplifying transistor. FIG. 9 indicates that the current flowing through the collector of the amplifying transistor changes in accordance with the control voltage VSW. Further, the current (represented by a solid line in FIG. 9) against the control voltage VSW in the radio frequency amplifier circuit 20 according to the second embodiment changes symmetrically with respect to the current (represented by a dotted line in FIG. 9) against the control voltage VSW in the radio frequency amplifier circuit 10 according to the first embodiment. Further, FIG. 9 also indicates that the current has its values changing against a portion of values of the control voltage VSW, and the current has an almost constant value with respect to another portion of the values of the control voltage VSW. Thus, it is possible to set the control voltage VSW so as to have a value within an increased range.

According to the second embodiment, a relationship between input power and output power of the radio frequency signal of the radio frequency amplifier circuit 20, a relationship between the power of the radio frequency signal inputted to the radio frequency amplifier circuit 20 and the current flowing through the collector of the amplifying transistor, and a relationship between the power of the radio frequency signal outputted by the radio frequency amplifier circuit 20 and the current flowing through the collector of the amplifying transistor represent characteristics almost similar to those shown in FIGS. 5 to 7, and therefore the relationships are not shown for the second embodiment.

As described above, the radio frequency amplifier circuit and the mobile communication terminal according to the second embodiment of the present invention allow the configuration of the bias circuit to be partially changed such that the control signal can be reversed, without addition of a logic circuit, in accordance with the control logic for switching between the high power output operation and the low power output operation, thereby reducing the circuit scale of the radio frequency circuit block.

Third Embodiment

Figure 10:
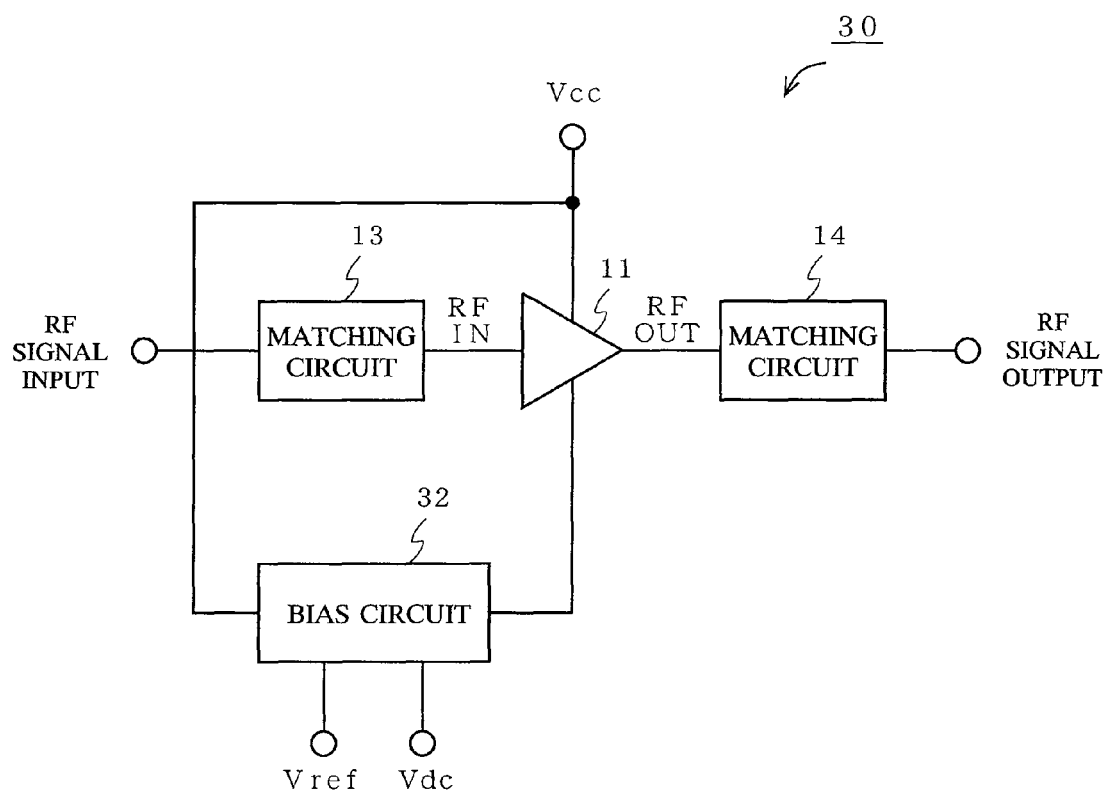
FIG. 10 is a diagram illustrating a configuration of a radio frequency amplifier circuit 30 according to a third embodiment of the present invention.
Figure 11:
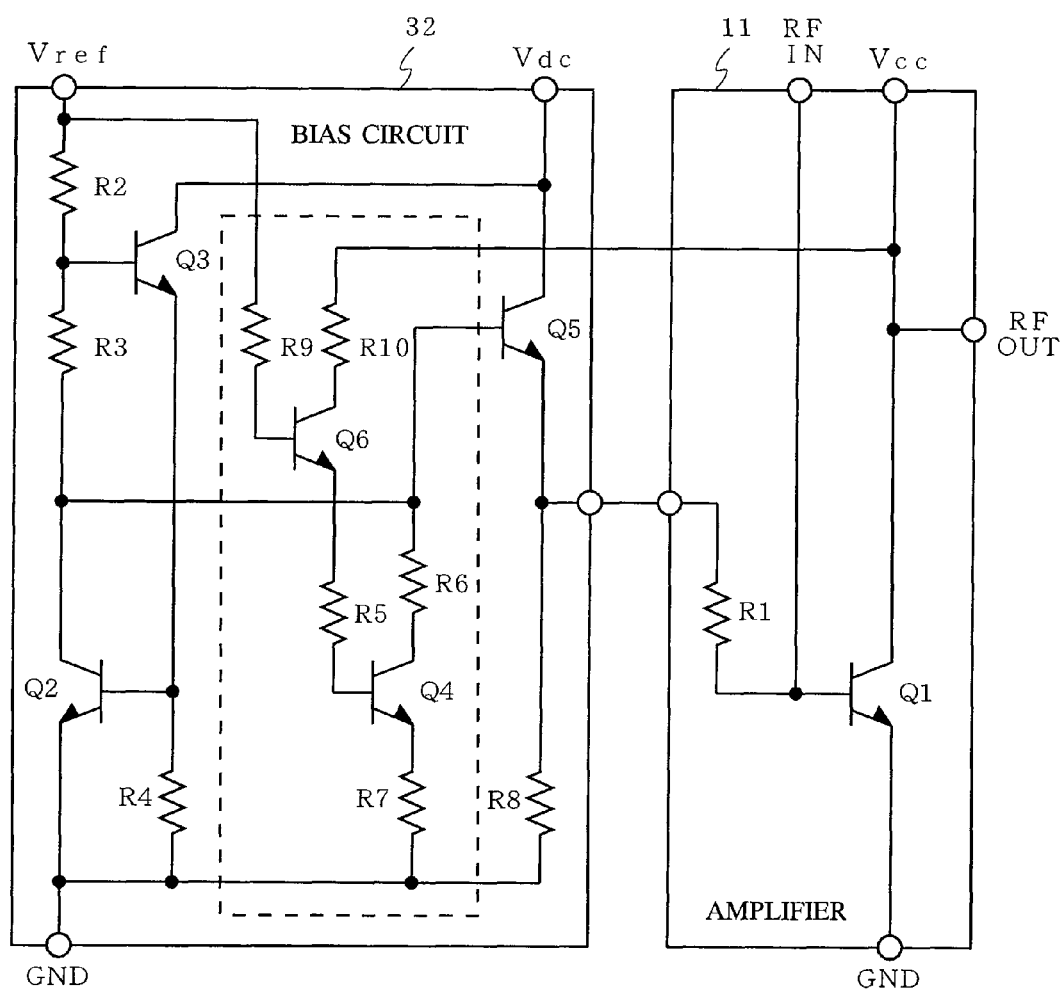
FIG. 11 is a diagram illustrating in detail a circuit configuration of the radio frequency amplifier circuit 30.
Figure 12:
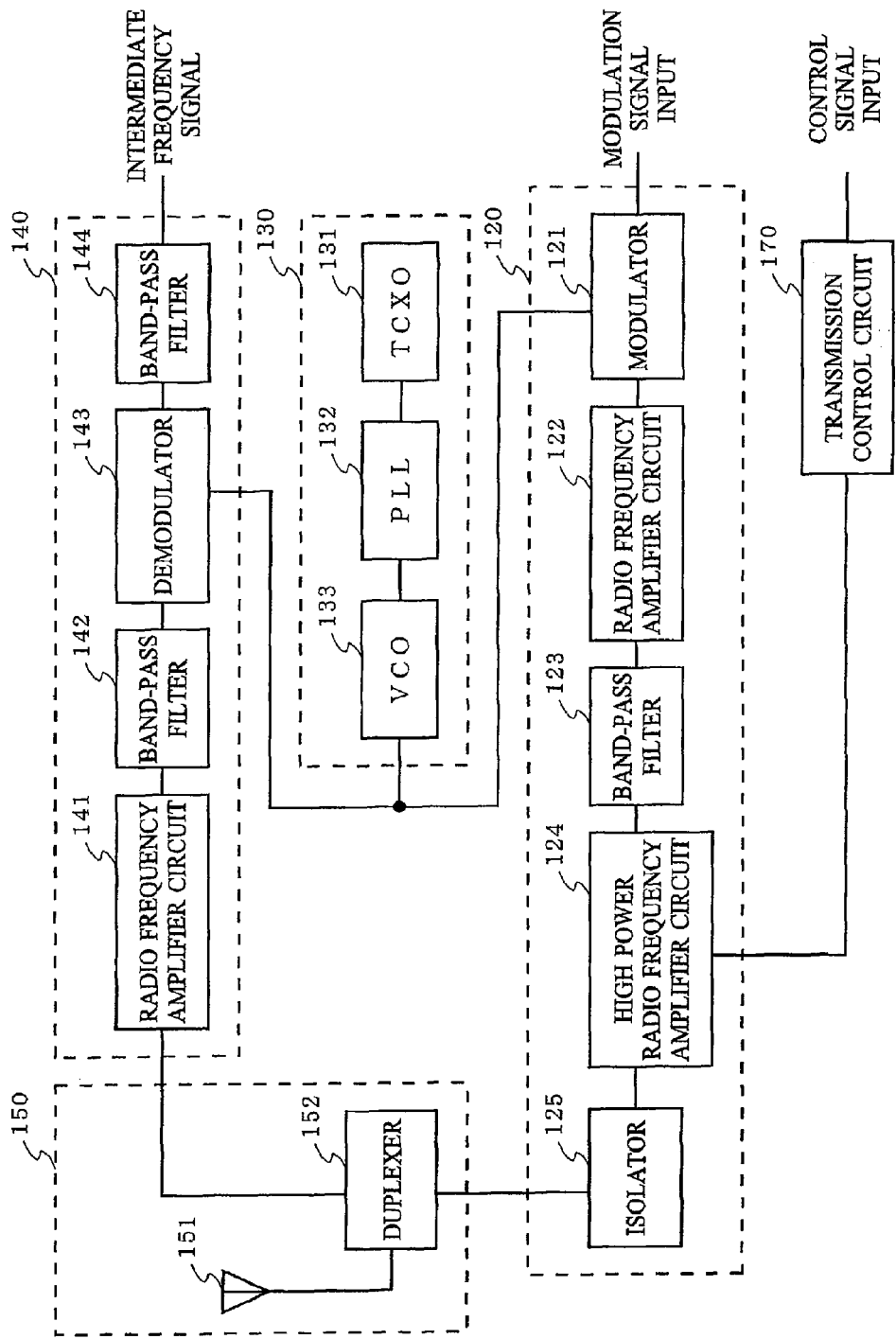
FIG. 12 is a diagram illustrating a configuration of a radio communication section of a mobile telephone terminal including the radio frequency amplifier circuit 30.

FIG. 10 is a block diagram illustrating a configuration of a radio frequency amplifier circuit 30 according to a third embodiment of the present invention. FIG. 11 is a diagram illustrating in detail a circuit configuration of the amplifier 11 and a bias circuit 32 of the radio frequency amplifier circuit 30. FIG. 12 is a block diagram illustrating a configuration of a radio communication section of a mobile telephone terminal including the radio frequency amplifier circuit 30.

Firstly, the radio communication section of the mobile telephone terminal shown in FIG. 12 will be described. Thereafter, the radio frequency amplifier circuit 30 will be described in detail. The radio communication section of the mobile telephone terminal shown in FIG. 12 has the same structure as the radio communication section of the mobile telephone terminal shown in FIG. 3 except that the transmission control circuit 170 is provided, in the radio communication section including the radio frequency amplifier circuit 30, instead of the control signal outputs section 160. Components other than the transmission control circuit 170 perform operations similar to those described above. The transmission control circuit 170 controls mode change performed by the high power radio frequency amplifier circuit 124 in accordance with an inputted control signal. The radio frequency amplifier circuit 30 according to the third embodiment is used as the high power radio frequency amplifier circuit 124.

Next, a configuration and an operation of the radio frequency amplifier circuit 30 will be described in detail with reference to FIGS. 10 and 11.

As shown in FIG. 10, the radio frequency amplifier circuit 30 includes the amplifier 11, a bias circuit 32, the matching circuit 13, and the matching circuit 14. The bias circuit 32 changes, based on a control signal for controlling a bias current of the radio frequency amplifier circuit 30, a bias current to be supplied to the amplifier 11. According to the third embodiment, the power supply voltage Vcc applied to the amplifier 11 is used as the control signal. The amplifier 11 amplifies, in accordance with the bias current supplied by the bias circuit 32, a radio frequency signal inputted via the matching circuit 13, and outputs, via the matching circuit 14, the radio frequency signal having been amplified. Thus, the amplifier 11 is capable of changing a level of the signal to be outputted. Each of the amplifier 11, the matching circuit 13, and the matching circuit 14 has the same configuration as described for the first and the second embodiments, and the general description thereof is not provided.

As shown in FIG. 11, the bias circuit 32 includes resistances R2, R3, R4, R5, R6, R7, R8, R9, and R10 and transistors Q2, Q3, Q4, Q5, and Q6. The transistor Q2 and the transistor Q3 are used for temperature compensation, and the transistor Q4 and the transistor Q6 for changing the bias. The transistors Q4 and Q6, and the resistances R5, R6, R7, R9, and R10 form a bias changing section (as shown by dotted lines in FIG. 11). Each of the transistors Q2, Q3, and Q5, and the resistances R2, R3, R4, R5, R6, R7, and R8 has the same structure as described for the first and the second embodiments, and the general description thereof is not provided.

To the resistance R2, the reference voltage Vref is applied at one terminal thereof, and the base of the transistor Q3 and one terminal of the resistance R3 are connected at the other terminal thereof. The other terminal of the resistance R3 is connected to the collector of the transistor Q2. The emitter of the transistor Q2 is grounded, and the base of the transistor Q2 is connected to the emitter of the transistor Q3 and one terminal of the resistance R4. The other terminal of the resistance R4 is grounded. The collector of the transistor Q4 is connected via the resistance R6 to the collector of the transistor Q2 and the base of the transistor Q5, and the emitter of the transistor Q4 is grounded via the resistance R7. The base of the transistor Q4 is connected to the emitter of the transistor Q6 via the resistance R5. The reference voltage Vref is applied to the base of the transistor Q6 via the resistance R9 and the power supply voltage Vcc is applied to the collectors of the transistor Q6 via the resistance R10. The emitter of the transistor Q5 is grounded via the resistance R8 and is connected via the resistance R1 to the base of the transistor Q1. The power supply voltage Vdc is applied to each of the collectors of the transistor Q3 and the transistor Q5. The transistor Q1 receives a radio frequency signal (RFIN) at the base, and amplifies the received radio frequency signal so as to output, from the collector, the radio frequency signal (RFOUT) having been amplified.

Firstly, when each of the reference voltage Vref and the power supply voltage Vdc is set so as to have a predetermined value and the power supply voltage Vcc is 1V (operation mode 1), the radio frequency amplifier circuit 30 operates as follows.

When an apply voltage (about 1.3V) between the base and the emitter of each of the transistors Q2, Q3, and Q5 is higher than a turn-on voltage, the transistors Q2, Q3, and Q5 are ON. As a result, the transistor Q1 operates. In the operation mode 1, a collector voltage of the transistor Q6 is lower than the power supply voltage Vcc of 1V. Therefore, the voltage between the base and the emitter of the transistor Q4 is lower than or equal to the turn-on voltage, so that the transistor Q4 is OFF. When the transistor Q4 is OFF, a circuit formed by the transistor Q4, the resistance R7, and the resistance R6, all of which are connected to the base of the transistor Q5, does not function.

Next, when each of the reference voltage Vref and the power supply voltage Vdc is set so as to have a predetermined value and the power supply voltage Vcc is 3.6V (operation mode 2), the radio frequency amplifier circuit 30 operates as follows.

The operations performed by the transistors Q2, Q3, and Q5 are the same as those performed in the operation mode 1 described above. In the operation mode 2, an apply voltage (about 1.3V) between the base and the emitter of each of the transistor Q4 and the transistor Q6 is higher than the turn-on voltage, so that the transistor Q4 and the transistor Q6 are ON. The circuit formed by the transistor Q4, the resistance R7, and the resistance R6, all of which are connected to the base of the transistor Q5, functions, so that a portion of the current to be supplied to the base of the transistor Q5 flows through the bias changing section corresponding to the circuit formed by the resistances R6 and R7, and the transistor Q4. Consequently, the current supplied to the base of the transistor Q5 is reduced as compared to that supplied in the operation mode 1, thereby reducing an operating current of the transistor Q1.

As described above, it is possible to control, in accordance with the power supply voltage Vcc of the amplifier 11, an amount of the base current of the transistor Q5 of the bias circuit 32, that is, an amount of the bias current of the transistor Q1

Figure 13:
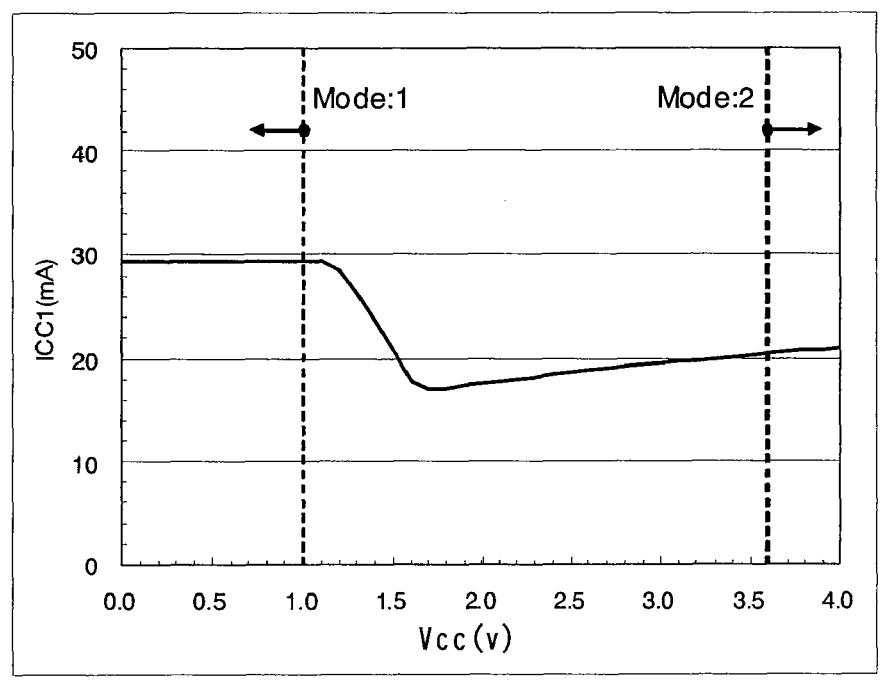
FIG. 13 is a diagram illustrating an example of radio frequency characteristic represented by the radio frequency amplifier circuit 30.

Next, the two operation modes of the radio frequency amplifier circuit 30 will be described in detail. A mode in which the radio frequency amplifier circuit 30 operates when the power supply voltage Vcc is 1V is defined as the operation mode 1. A mode in which the radio frequency amplifier circuit 30 operates when the power supply voltage Vcc is 3.6V is defined as the operation mode 2. FIG. 13 is a diagram illustrating a relationship between the power supply voltage Vcc applied to the radio frequency amplifier circuit 30 and the current flowing through the collector of the amplifying transistor. FIG. 13 indicates that the current flowing through the collector of the amplifying transistor changes in accordance with the power supply voltage Vcc. FIG. 13 indicates that the current has its values changing against a portion of values of the power supply voltage Vcc, and the current has an almost constant value with respect to another portion of the values of the power supply voltage Vcc. Thus, it is possible to set the power supply voltage Vcc so as to have a value within an increased range.

When the power supply voltage Vcc is set as 3.6V (operation mode 2), a relationship between input power and output power of the radio frequency signal of the radio frequency amplifier circuit 30, a relationship between the power of the radio frequency signal inputted to the radio frequency amplifier circuit 30 and the current flowing through the collector of the amplifying transistor, and a relationship between the power of the radio frequency signal outputted by the radio frequency amplifier circuit 30 and the current flowing through the collector of the amplifying transistor represent characteristics almost similar to those shown in FIGS. 5 to 7, and therefore the relationships are not shown for the third embodiment.

Here, an example where the power supply voltage is set, and an exemplary setting range in which values of the resistances R2, R3, R4, R5, R6, R7, R8, R9, and R10 are set, will be described.

In the third embodiment, the reference voltage Vref is set as 2.8V and the power supply voltage Vdc is set as 3.6V. The resistances R2, R3, R4, R5, R6, and R7 each has a value as described for the first embodiment. A value of the resistance R8 is about 1 kΩ to 10 kΩ. A value of the resistance R9 is about 1 kΩ to 100 kΩ. A value of the resistance R10 is about 1Ω to 100 kΩ.

As described above, the radio frequency amplifier circuit and the mobile communication terminal according to the third embodiment of the present invention allow a current of the bias circuit to be changed in accordance with the power supply voltage Vcc, thereby controlling the bias current of the amplifier. Thus, it is unnecessary to provide a circuit for controlling the control voltage VSW, thereby increasingly reducing the circuit scale of the radio frequency circuit block.

Fourth Embodiment

Figure 14:
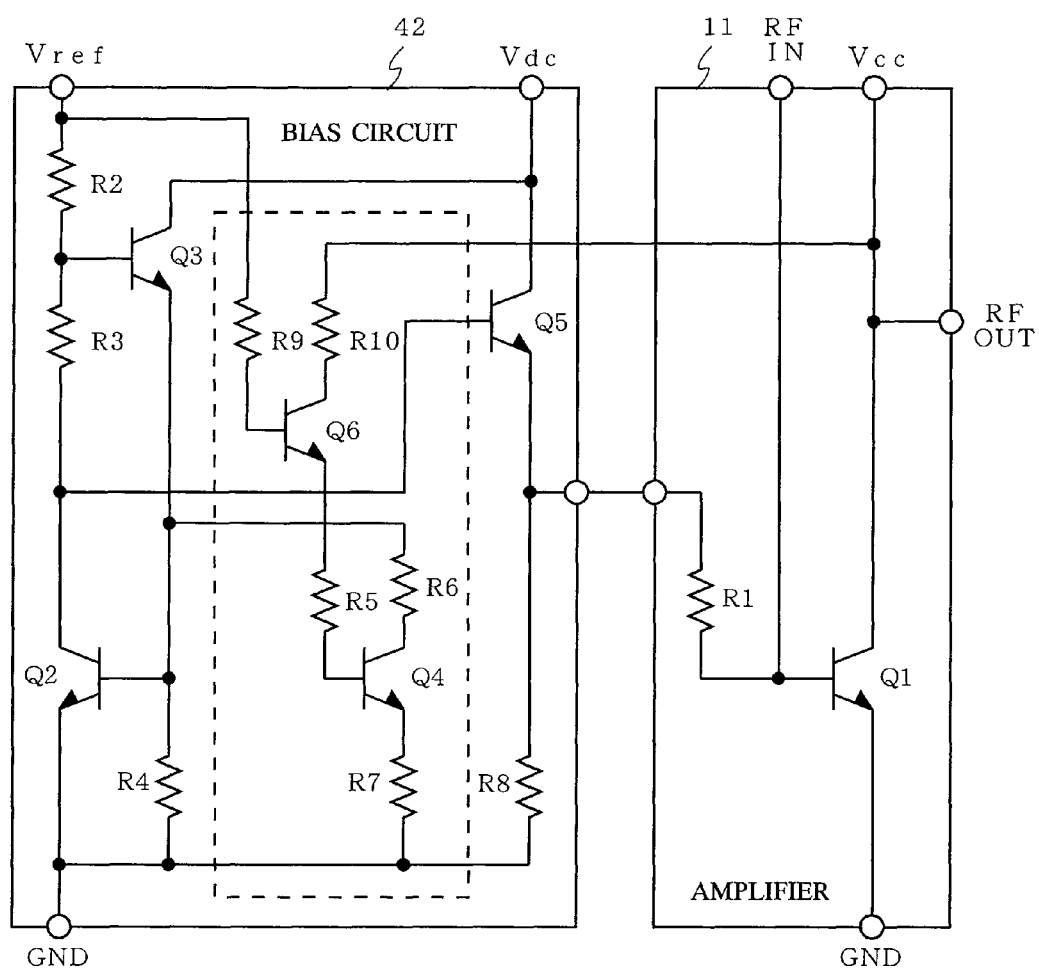
FIG. 14 is a diagram illustrating a configuration of a radio frequency amplifier circuit 40 according to a fourth embodiment of the present invention.

FIG. 14 is a diagram illustrating in detail a circuit configuration of the amplifier 11 and a bias circuit 42 of a radio frequency amplifier circuit 40 according to a fourth embodiment of the present invention. The radio frequency amplifier circuit 40 according to the fourth embodiment has the same configuration as the radio frequency amplifier circuit 30 according to the third embodiment except that the bias circuit 42 is used, in the radio frequency amplifier circuit 40, instead of the bias circuit 32. Therefore, FIG. 10 is used as a block diagram also illustrating a configuration of the radio frequency amplifier circuit 40, and a block diagram and description are not additionally provided for the radio frequency amplifier circuit 40. In the fourth embodiment, the radio frequency amplifier circuit 40 is used as the high power radio frequency amplifier circuit 124. Therefore, FIG. 12 is a block diagram also illustrating a configuration of a radio communication section of the mobile telephone terminal including the radio frequency amplifier circuit 40, and a block diagram and description of the radio communication section of the fourth embodiment are not additionally provided.

As shown in FIG. 14, the bias circuit 42 includes resistances R2, R3, R4, R5, R6, R7, R8, R9, and R10, and transistors Q2, Q3, Q4, Q5, and Q6. Those components are the same as those of the bias circuit 32 shown in FIG. 11 except that, in the bias circuit 42, the collector of the transistor Q4 is connected via the resistance R6 to the emitter of the transistor Q3 instead of the base of the transistor Q5.

Hereinafter, the operation performed by the bias circuit 42 of the configuration as described above will be described. The fundamental operation of the bias circuit 42 is the same as that of the bias circuit 32.

Firstly, when each of the reference voltage Vref and the power supply voltage Vdc is set so as to have a predetermined value, and the power supply voltage Vcc is 1V (operation mode 1), a voltage between the base and the emitter of the transistor Q4 is lower than or equal to the turn-on voltage, so that the transistor Q4 is OFF. In this case, the base current of the transistor Q2 and the emitter current of the transistor Q2 depend on a value of the resistance R4.

Next, each of the reference voltage Vref and the power supply voltage Vdc is set so as to have a predetermined value and the power supply voltage Vcc is 3.6V (operation mode 2), a voltage between the base and the emitter of the transistor Q4 is higher than or equal to the turn-on voltage, so that the transistor Q4 is ON. Therefore, configured is a circuit in which the resistance R4 via which the base of the transistor Q2 is grounded, and a resistance formed by serially connecting between the resistance R6 and the resistance R7, are connected in parallel with each other, so that a resistance value is reduced as compared to in the operation mode 1 in which the power supply voltage Vcc is 1V, thereby reducing a base voltage of the transistor Q2. Therefore, the base current of the transistor Q2 is reduced, and a current flowing through the collector of the transistor Q2 is reduced, thereby increasing the current flowing through the base of the transistor Q5. Consequently, the current outputted from the emitter of the transistor Q5 is increased and the bias current supplied to the transistor Q1 of the amplifier 11 is increased.

FIG. 15 is a diagram illustrating a relationship between the power supply voltage Vcc applied to the radio frequency amplifier circuit 40 and the current flowing through the collector of the amplifying transistor. FIG. 15 indicates that the current flowing through the collector of the amplifying transistor changes in accordance with the power supply voltage Vcc. Further, the current (represented by a solid line in FIG. 15) against the power supply voltage Vcc in the radio frequency amplifier circuit 40 according to the fourth embodiment changes symmetrically with respect to the current (represented by a dotted line in FIG. 15) against the power supply voltage Vcc in the radio frequency amplifier circuit 30 according to the third embodiment. Further, FIG. 15 also indicates the current has its values changing against a portion of values of the power supply voltage Vcc, and the current has an almost constant value with respect to another portion of the values of the power supply voltage Vcc. Thus, it is possible to set the power supply voltage Vcc so as to have a value within an increased range.

According to the fourth embodiment, a relationship between input power and output power of the radio frequency signal of the radio frequency amplifier circuit 40, a relationship between the power of the radio frequency signal inputted to the radio frequency amplifier circuit 40 and the current flowing through the collector of the amplifying transistor, and a relationship between the power of the radio frequency signal outputted by the radio frequency amplifier circuit 40 and the current flowing through the collector of the amplifying transistor represent characteristics almost similar to those shown in FIGS. 5 to 7, and therefore the relationships are not shown for the fourth embodiment.

As described above, the radio frequency amplifier circuit and the mobile communication terminal according to the fourth embodiment of the present invention allow the configuration of the bias circuit to be partially changed, and therefore the operating current of the amplifier can be changed without addition of a logic circuit, thereby reducing the circuit scale of the radio frequency circuit block.

Fifth Embodiment

Figure 16:
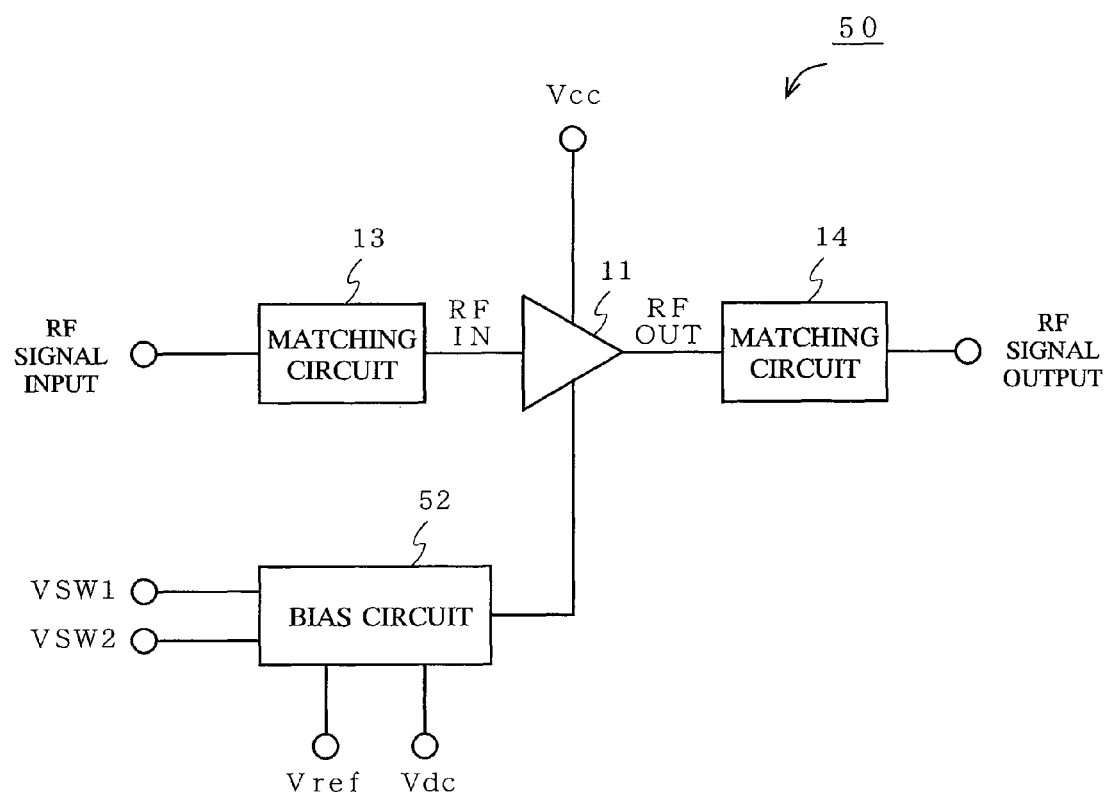
FIG. 16 is a diagram illustrating a configuration of a radio frequency amplifier circuit 50 according to a fifth embodiment of the present invention.
Figure 17:
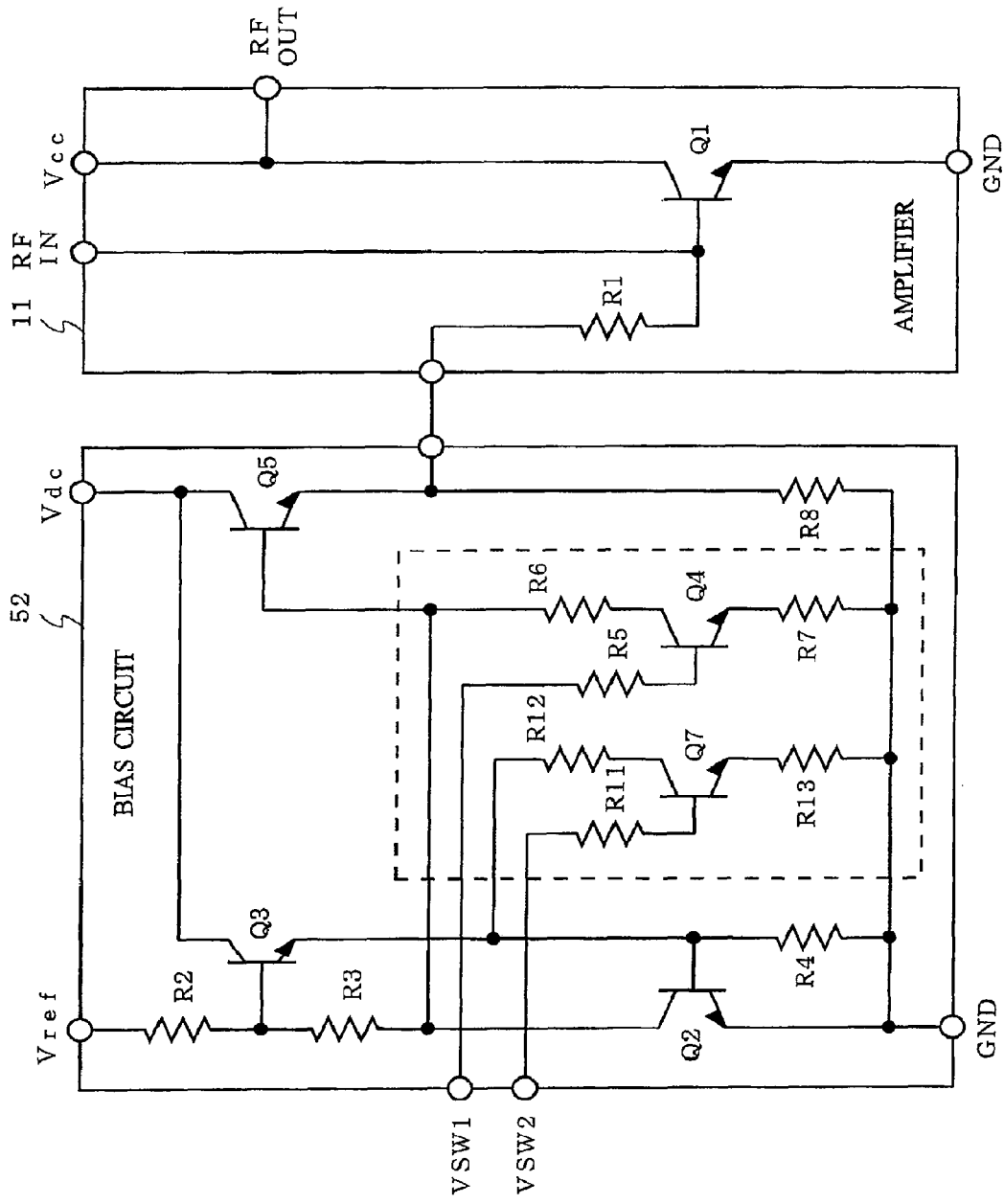
FIG. 17 is a diagram illustrating in detail a circuit configuration of the radio frequency amplifier circuit 50.

FIG. 16 is a block diagram illustrating a configuration of a radio frequency amplifier circuit 50 according to a fifth embodiment of the present invention. FIG. 17 is a diagram illustrating in detail a circuit configuration of the amplifier 11 and a bias circuit 52 of the radio frequency amplifier circuit 50.

The radio frequency amplifier circuit 50 according to the fifth embodiment has the same configuration as the radio frequency amplifier circuit 10 according to the first embodiment except that a bias circuit 52 is used, in the radio frequency amplifier circuit 50, instead of the bias circuit 12. In the fifth embodiment, the radio frequency amplifier circuit 50 is used as the high power radio frequency amplifier circuit 124. FIG. 3 is used as a block diagram also illustrating a configuration of a radio communication section of a mobile telephone terminal including the radio frequency amplifier circuit 50 of the fifth embodiment.

As shown in FIG. 17, the bias circuit 52 is the same as the bias circuit 12 of the first embodiment shown in FIG. 2 except that the bias circuit 52 further includes a bias changing section formed by a transistor Q7 and resistances R11, R12, and R13 operating by using the control voltage VSW2. The bias changing section additionally included in the bias circuit 52 corresponds to the bias changing section of the bias circuit 22, described for the second embodiment, formed by the transistor Q4 and the resistances R5, R6, and R7 as shown in FIG. 8.

Hereinafter, an operation performed by the bias circuit 52 of the configuration as described above will be described. The fundamental operation of the bias circuit 52 is the same as that of each of the bias circuits 12 and 22.

Firstly, when each of the reference voltage Vref, the power supply voltage Vdc, and the power supply voltage Vcc is set so as to have a predetermined value, the control voltage VSW1 is 0V and the control voltage VSW2 is 3V (operation mode 1), a voltage between the base and the emitter of the transistor Q4 is 0V, so that the transistors Q4 is OFF, whereas a voltage between the base and the emitter of the transistors Q7 is 3V, so that the transistor Q7 is ON. In this state, a circuit formed by the transistor Q4, the resistance R7, and the resistance R6, all of which are connected to the base of the transistor Q5, does not function. Further, configured is a circuit in which the resistance R4 via which the base of the transistor Q2 is grounded, and a resistance formed by serially connecting between the resistance R6 and the resistance R7, are connected in parallel with each other, so that a resistance value is reduced and therefore the base voltage of the transistor Q2 is reduced. Therefore, the base current of the transistor Q2 id reduced, and a current flowing through the collector of the transistor Q2 is reduced, thereby increasing a current flowing through the base of the transistor Q5. Consequently, the current outputted from the emitter of the transistor Q5 is increased and the bias current supplied to the transistor Q1 of the amplifier 11 is increased.

Next, when each of the reference voltage Vref, the power supply voltage Vdc, and the power supply voltage Vcc is set so as to have a predetermined value, and the control voltage VSW1 is 0V and the control voltage VSW2 is 0V (operation mode 2), a voltage between the base and the emitter of each of the transistor Q4 and the transmitter Q7 is 0V, so that the transistor Q4 and the transistor Q7 are OFF. In this state, the circuit formed by the transistor Q4, the resistance R7, and the resistance R6, and a circuit formed by the transistor Q7, the resistance R13 and the resistance R12 do not function.

In the operation mode 2, a value of the resistance via which the base of the transistor Q2 is grounded is increased, and the base voltage of the transistor Q2 is increased as compared to in the operation mode 1. Therefore, the base current of the transistor Q2 is increased, and the current flowing through the collector of the transistor Q2 is increased, thereby reducing the current flowing through the base of the transistor Q5. As a result, the current outputted from the emitter of the transistor Q5 is reduced as compared to that outputted in the operation mode 1, thereby reducing the bias current supplied to the transistor Q1 of the amplifier 11.

Lastly, when each of the reference voltage Vref, the power supply voltage Vdc, and the power supply voltage Vcc is set so as to have a predetermined value, and the control voltage VSW1 is 3V and the control voltage VSW2 is 0V (operation mode 3), a voltage between the base and the emitter of the transistor Q4 is 3V, so that the transistor Q4 is ON, and a voltage between the base and the emitter of the transistor Q7 is 0V, so that the transistor Q7 is OFF. In this state, the circuit formed by the transistor Q7, the resistance R13, and the resistance R12, all of which are connected to the base of the transistor Q2, does not function. On the other hand, the circuit formed by the transistor Q4, the resistance R7, and the resistance R6, all of which are connected to the base of the transistor Q5, functions, so that a portion of the current to be supplied to the base of the transistor Q5 flows through the bias changing section. Consequently, the current supplied to the base of the transistor Q5 is reduced as compared to that supplied in the operation mode 2, thereby reducing an operating current of the transistor Q1 of the amplifier 11.

FIG. 18 is a diagram illustrating a relationship between the control voltages VSW1 and VSW2 applied to the radio frequency amplifier circuit 50, and the current flowing through the collector of the amplifying transistor. FIG. 18 indicates that the current flowing through the collector of the amplifying transistor changes in accordance with the control voltages VSW1 and VSW2.

According to the fifth embodiment, a relationship between input power and output power of the radio frequency signal of the radio frequency amplifier circuit 50, a relationship between the power of the radio frequency signal inputted to the radio frequency amplifier circuit 50 and the current flowing through the collector of the amplifying transistor, and a relationship between the power of the radio frequency signal outputted by the radio frequency amplifier circuit 50 and the current flowing through the collector of the amplifying transistor represent characteristics almost similar to those shown in FIGS. 5 to 7, and therefore the relationships are not shown for the fifth embodiment.

As described above, the radio frequency amplifier circuit and the mobile communication terminal according to the fifth embodiment of the present invention allow a current of the bias circuit to be changed in accordance with the control voltage VSW which has values changing within an increased setting range of the values, thereby controlling the bias current of the amplifier. Thus, it is unnecessary to provide a high precision A/D converter, thereby reducing the circuit scale of the radio frequency circuit block.

Sixth Embodiment

Figure 19:
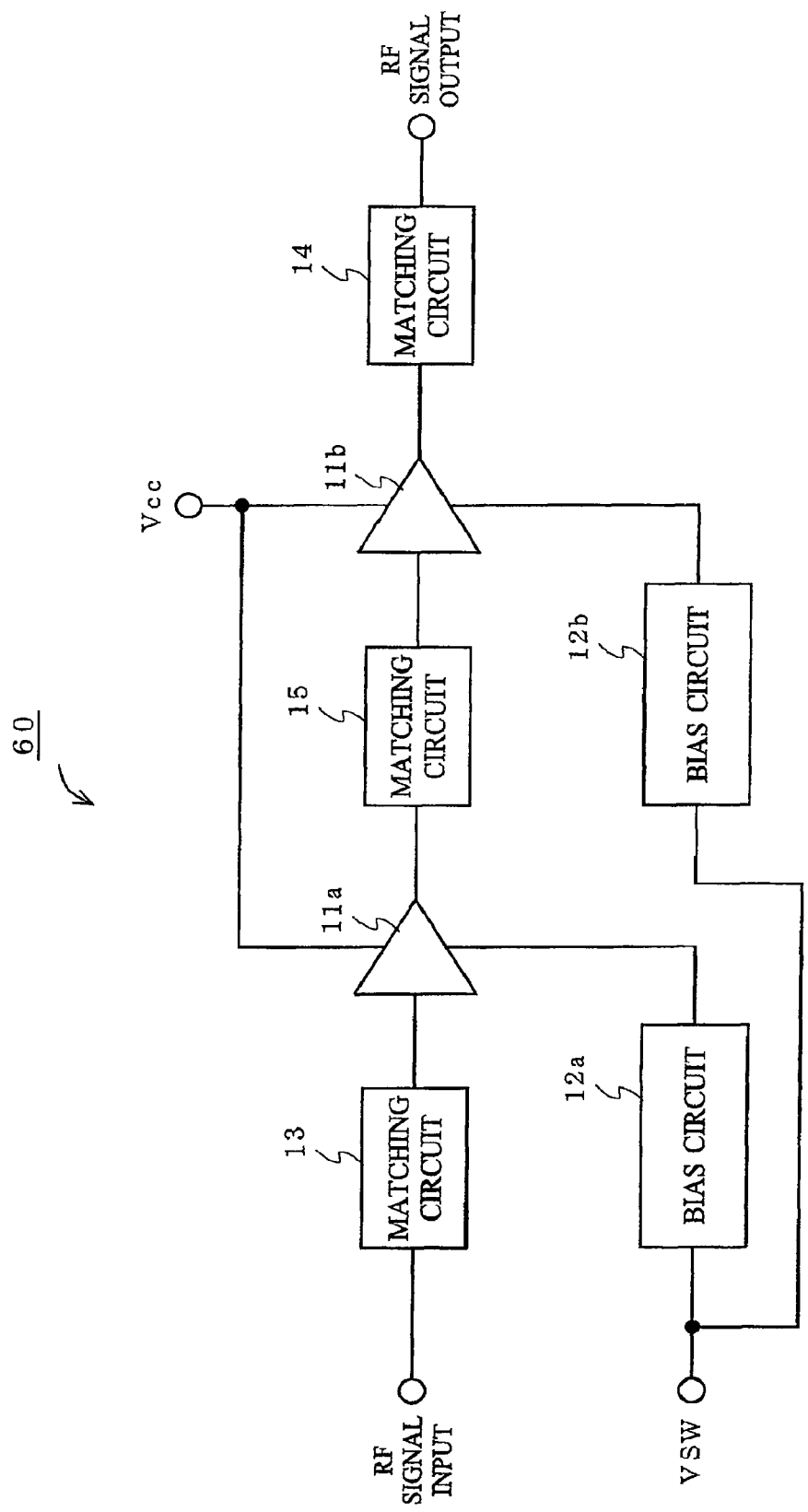
FIG. 19 is a diagram illustrating a configuration of a radio frequency amplifier circuit 60 according to a sixth embodiment of the present invention.

FIG. 19 is a block diagram illustrating a configuration of a radio frequency amplifier circuit 60 according to a sixth embodiment of the present invention. As shown in FIG. 19, the radio frequency amplifier circuit 60 according to the sixth embodiment includes a plurality of the radio frequency amplifier circuits 10 of the first embodiment operating in conjunction with each other, or a plurality of the radio frequency amplifier circuits 20 of the second embodiment operating in conjunction with each other, or a combination of at least one radio frequency amplifier circuit 10 of the first embodiment and at least one radio frequency amplifier circuit 20 of the second embodiment. A fundamental configuration of each of the amplifiers and a fundamental configuration of each of the bias circuits of the radio frequency amplifier circuit 60 are the same as shown in FIGS. 2 and 8, and a diagram and description thereof are not provided for the radio frequency amplifier circuit 60. The radio frequency amplifier circuit 60 is used as the high power radio frequency amplifier circuit 124. FIG. 3 is used as a block diagram also illustrating a configuration of a radio communication section of the mobile telephone terminal including the radio frequency amplifier circuit 60, and a drawing and description thereof are not additionally provided for the sixth embodiment.

The radio frequency amplifier circuit 60 is configured such that two radio frequency amplifier circuits 10 are coupled with each other, or two radio frequency amplifier circuits 20 are coupled with each other, or the radio frequency amplifier circuit 10 and the radio frequency amplifier circuit 20 are coupled with each other so as to form a serial connection therebetween, and a matching circuit 15 provided at the coupling portion is commonly used. The control voltage VSW is applied, as a control signal for controlling a bias current of the radio frequency amplifier circuit 60, to both the bias circuit 12a and the bias circuit 12b.

With reference to FIG. 19, the configuration and the operation of the radio frequency amplifier circuit 60 will be described in detail.

Each of the matching circuits 13 to 15 is an impedance matching circuit for subjecting an input signal to impedance conversion. The bias circuit 12a changes, based on the control voltage VSW, a bias current to be supplied to an amplifier 11a. The bias circuit 12b changes, based on the control voltage VSW, a bias current to be supplied to an amplifier 11b. The amplifier 11a amplifies, in accordance with the bias current supplied by the bias circuit 12a, a radio frequency signal inputted via the matching circuit 13, and outputs, via the matching circuit 15, the radio frequency signal having been amplified. The amplifier 11b amplifies, in accordance with the bias current supplied by the bias circuit 12b, a radio frequency signal inputted via the matching circuit 15, and outputs, via the matching circuit 14, the radio frequency signal having been amplified. Thus, each of the amplifier 11a and the amplifier 11b is capable of changing a level of a signal to be outputted.

As described above, the multimode mobile communication terminal requires the radio frequency amplifier circuit of the radio frequency circuit block to represent enhanced linear characteristic as compared to characteristic represented in the sound communication system. The radio frequency amplifier circuit enhancing the liner characteristic requires an operating current to be increased. Therefore, the radio frequency amplifier circuits of the first and the second embodiments each changes the operating current flowing through the amplifier so as to realize operation modes applicable to two systems.

In general, however, when the bias current flowing through the radio frequency amplifier circuit is changed in accordance with the control voltage VSW, the operating current is changed, thereby changing power gain. Further, in the radio frequency circuit block of the mobile communication terminal, when the gain of the radio frequency amplifier circuit is changed by changing the operation mode, a parameter contained in a correction table for power gain is required to have the increased number of values, thereby complicating the control. Therefore, it is necessary to reduce a difference in power gain among the operation modes. In the sixth embodiment, the difference in power gain among the operation modes is reduced in the following manner.

The two operation modes of the radio frequency amplifier circuit 60 will be described. A mode in which the radio frequency amplifier circuit 60 operates when the control voltage VSW is 0V is defined as the operation mode 1. A mode in which the radio frequency amplifier circuit 60 operates when the control voltage VSW is 3V is defined as the operation mode 2. When the radio frequency amplifier circuit 60 has two operation modes, a mode in which each of the amplifiers 11a and 11b operates when the control voltage VSW is 0V is defined as the operation mode 1 in which the bias current is "large", and a mode in which each of the amplifiers 11a and 11b operates when the control voltage VSW is 3V is defined as the operation mode 2 in which the bias current is "small". In the operation mode in which enhanced linear characteristic is required, the bias current of the amplifier 11a is set so as to have a "small" value, and the bias current of the amplifier 11b is set so as to have a "large" value. On the other hand, in the operation mode in which enhanced linear characteristic is not required, the bias current of the amplifier 11a is set so as to have a "large" value, and the bias current of the amplifier 11b is set so as to have a "small" value. That is, the bias current of the amplifier 11a and the bias current of the amplifier 11b are set such that the bias current of the amplifier 11a and the bias current of the amplifier 11b have values which change so as to be inversely proportional to each other. Thus, the radio frequency amplifier circuit 60 is capable of reducing the difference in power gain among the respective operation modes.

An operation performed by the radio frequency amplifier circuit 60 which uses, as the bias circuit 12a, the bias circuit 22 (shown in FIG. 8) according to the second embodiment, and uses, as the bias circuit 12b, the bias circuit 12 (shown in FIG. 2) according to the first embodiment will be described.

Figure 20:
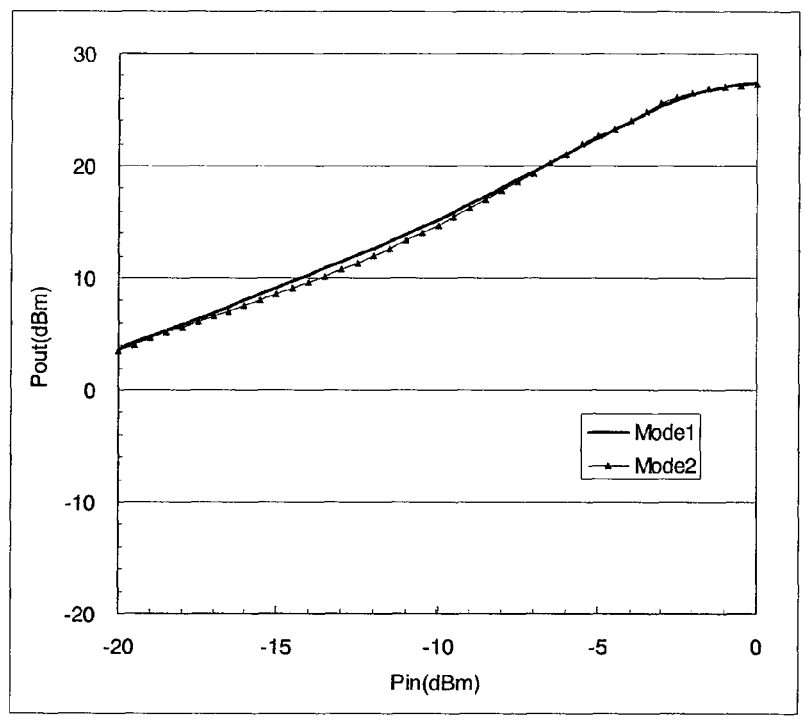
FIGS. 20 and 21 are diagrams each illustrating an example of radio frequency characteristic represented by the radio frequency amplifier circuit 60.
Figure 21:
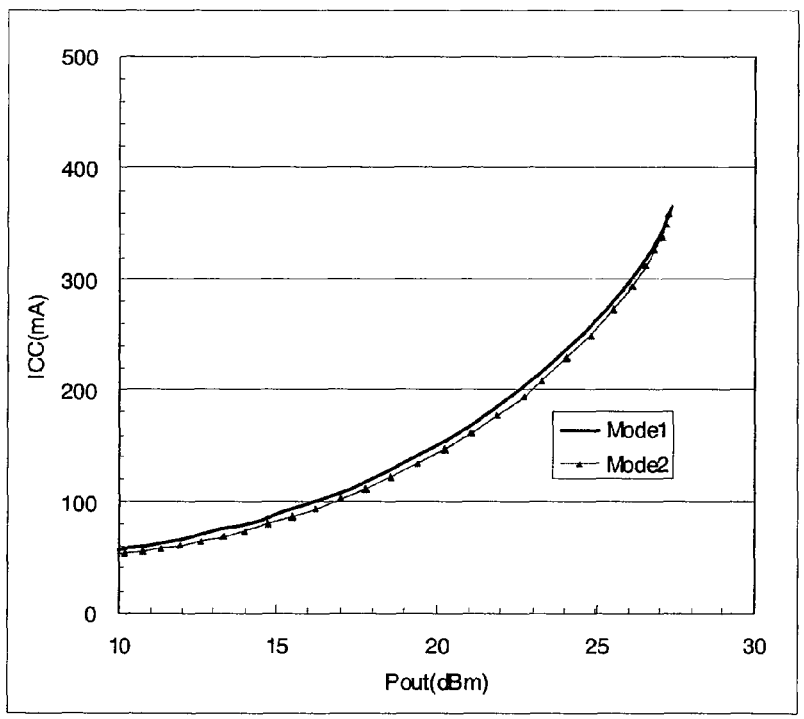

FIG. 20 is a diagram illustrating a relationship between input power and output power of the radio frequency signal of the radio frequency amplifier circuit 60. FIG. 21 is a diagram illustrating a relationship between the power of the radio frequency signal outputted by the radio frequency amplifier circuit 60 and the current flowing through the collector of the amplifying transistor. Each of FIG. 20 and FIG. 21 also illustrates power characteristics obtained in the operation mode 1 and the operation mode 2.

FIG. 20 indicates that the output power has almost the same value, between the two operation modes, with respect to most of values of the input power. In other words, FIG. 20 indicates that the power gain of the operation mode 1 has almost the same value as the power gain of the operation mode 2. FIG. 21 indicates that the current flowing through the collector of the amplifying transistor changes in accordance with the output power, and the operating current is larger in the operation mode 1 than in the operation mode 2. That is, the linear characteristic is enhanced in the operation mode 1 as compared to in the operation mode 2.

Exemplary manners in which the power supply voltages of the radio frequency amplifier circuit 60 are set, and an exemplary setting range in which each of the values of the resistances R2, R3, R4, R5, R6, R7, and R8 is set in each of the bias circuits 12a and 12b, are the same as described above. Further, when the mobile communication terminal and the radio frequency amplifier circuit have different control logics from each other, whether the radio frequency amplifier circuit 10 of the first embodiment or the radio frequency amplifier circuit 20 of the second embodiment is to be used may be determined based on the logic of the control signal. Thus, it is unnecessary to increase the circuit scale of the radio frequency amplifier circuit, and the radio frequency amplifier circuit can be used in a flexible manner. When an input terminal of the matching circuit 13 of the radio frequency amplifier circuit 60 shown in FIG. 19 has an infinite DC impedance, the input terminal may be used as both a terminal for receiving the radio frequency signal and a terminal for receiving the control voltage VSW. Therefore, the number of terminals can be reduced, thereby reducing a mounting area of the radio frequency amplifier circuit.

As described above, in the radio frequency amplifier circuit and the mobile communication terminal according to the sixth embodiment of the present invention, the number of amplifiers provided is increased so as to connect the amplifiers to each other such that, when the power gain is increased by controlling the bias current of the amplifier, the bias circuits supply, to the respective corresponding amplifiers, the bias currents which have values changing so as to be inversely proportional to each other. Therefore, the change of the power gain in accordance with the control voltage can be suppressed.

Seventh Embodiment

Figure 22:
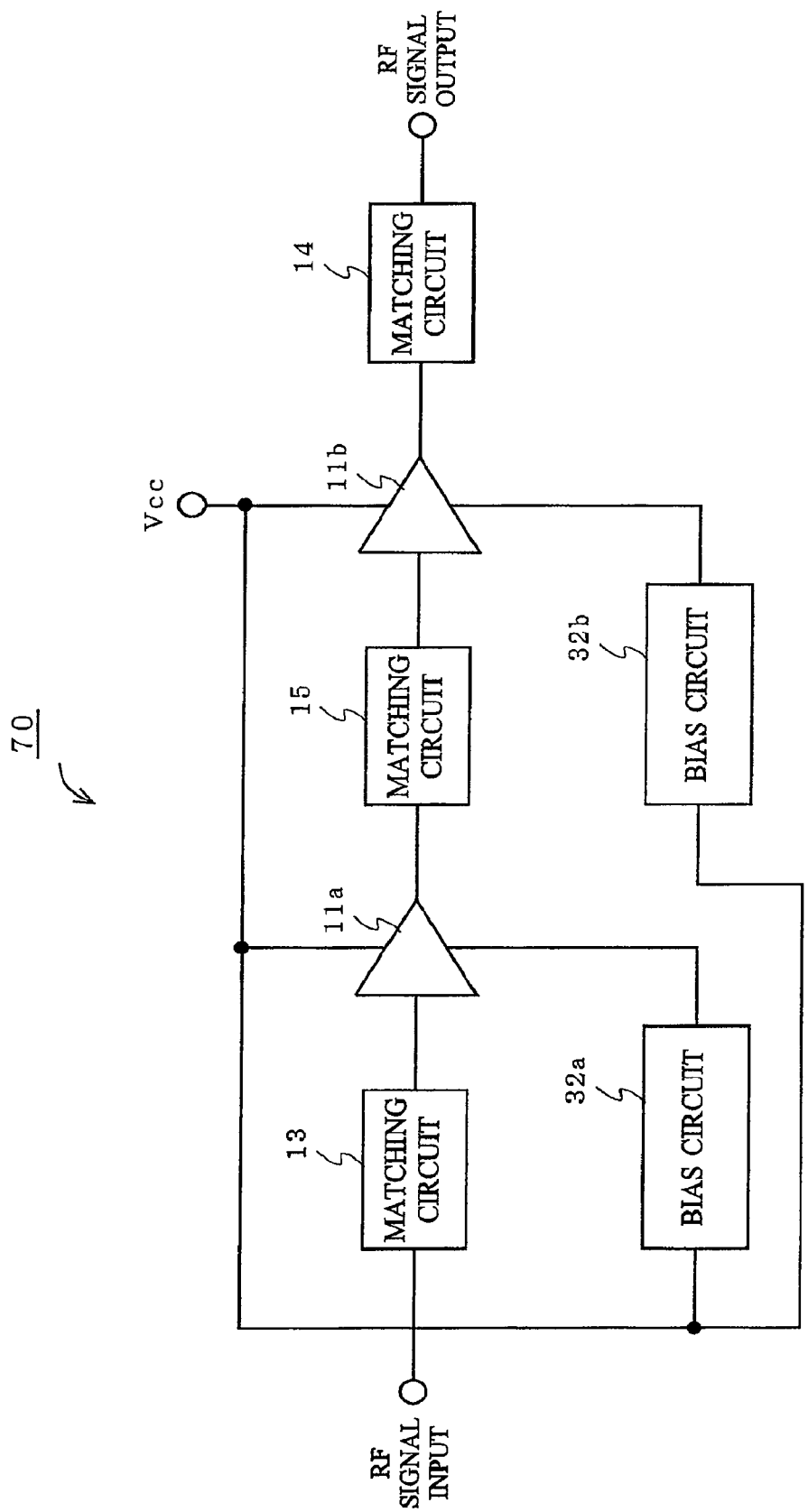
FIG. 22 is a diagram illustrating a configuration of a radio frequency amplifier circuit 70 according to a seventh embodiment of the present invention.
Figure 23:
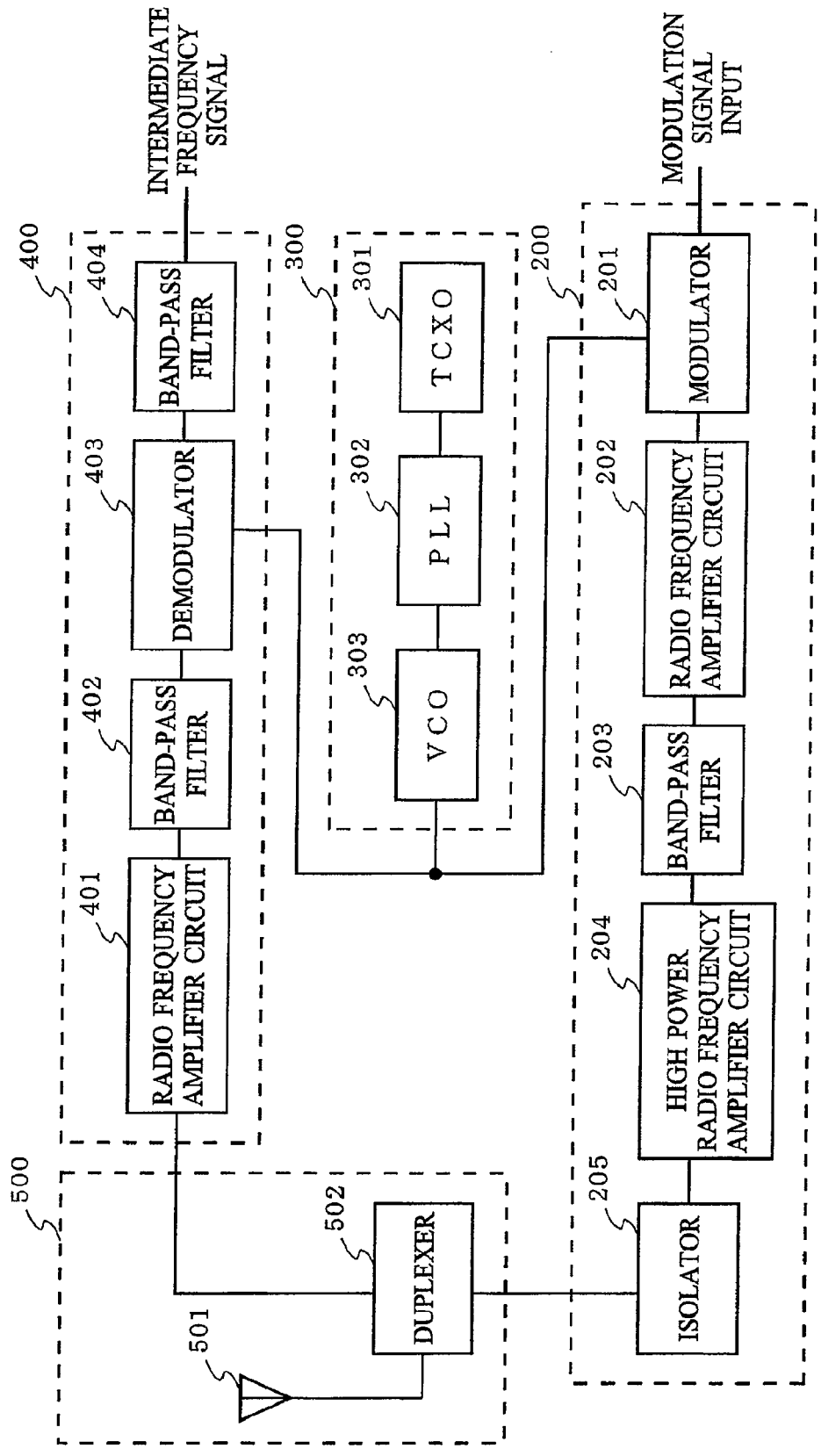
FIG. 23 is a diagram illustrating a configuration of a radio communication section of a conventional mobile telephone terminal.
Figure 24:
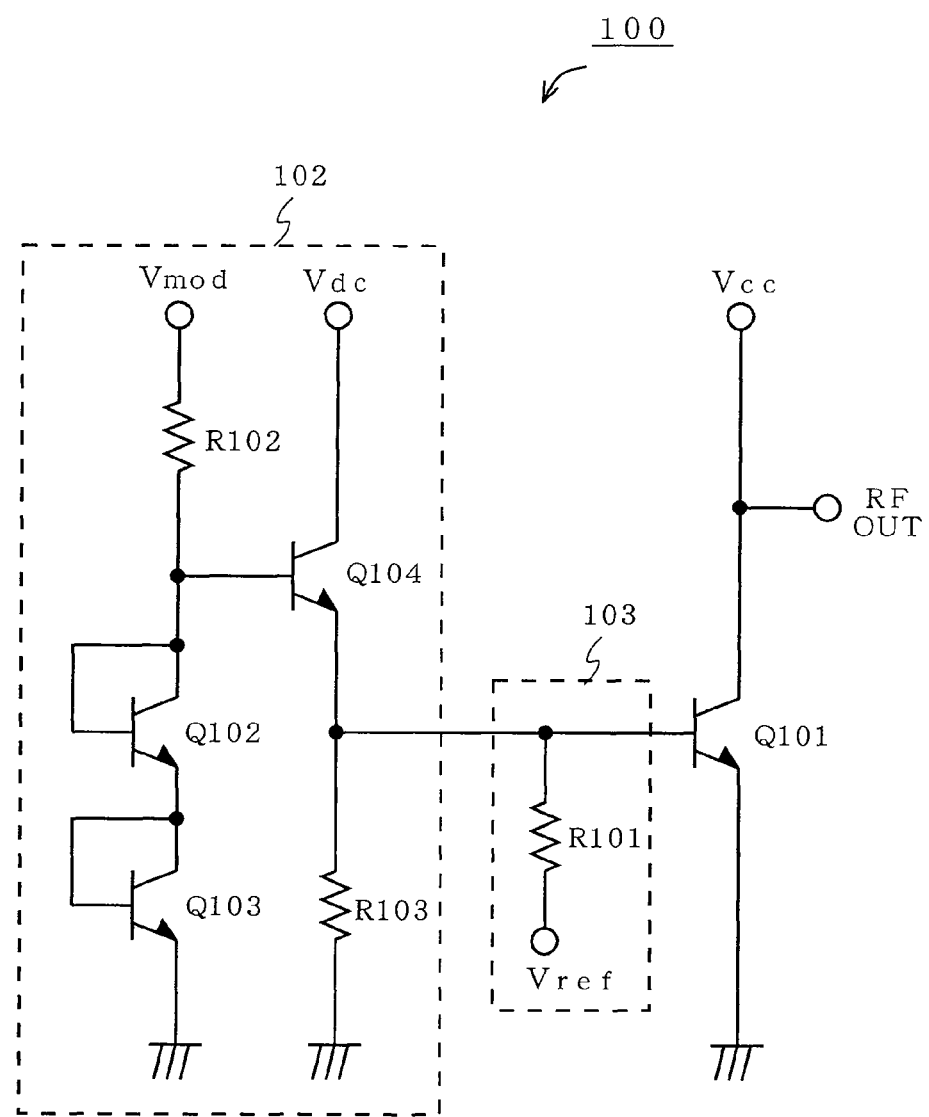
FIG. 24 is a diagram illustrating a configuration of an amplifier of a conventional radio frequency amplifier circuit.

FIG. 22 is a block diagram illustrating a configuration of a radio frequency amplifier circuit 70 according to a seventh embodiment of the present invention. As shown in FIG. 22, the radio frequency amplifier circuit 70 according to the seventh embodiment includes a plurality of the radio frequency amplifier circuits 30 of the third embodiment operating in conjunction with each other, or a plurality of the radio frequency amplifier circuits 40 of the fourth embodiment operating in conjunction with each other, or a combination of at least one radio frequency amplifier circuit 30 of the third embodiment and at least one radio frequency amplifier circuit 40 of the fourth embodiment. Further, a fundamental configuration of each of the amplifiers and a fundamental configuration of each of the bias circuits of the radio frequency amplifier circuit 70 are the same as shown in FIGS. 11 and 14, and a drawing and description thereof are not provided for the radio frequency amplifier circuit 70. The radio frequency amplifier circuit 70 is used as the high power radio frequency amplifier circuit 124. FIG. 12 is used as a block diagram also illustrating a configuration of a radio communication section of a mobile telephone terminal including the radio frequency amplifier circuit 70, and a drawing and description thereof are not provided for the seventh embodiment.

The radio frequency amplifier circuit 70 is configured such that two radio frequency amplifier circuits 30 are coupled with each other, two radio frequency amplifier circuits 40 are coupled with each other, or the radio frequency amplifier circuit 30 and the radio frequency amplifier circuit 40 are coupled with each other, so as to form a serial connection therebetween, and the matching circuit 15 provided at the coupling portion is commonly used. The power supply voltage Vcc is applied, as a control signal for controlling a bias current of the radio frequency amplifier circuit 70, to both a bias circuit 32a and a bias circuit 32b.

The power supply voltage Vcc of the radio frequency amplifier circuit 70 is changed in accordance with a level of a signal inputted to the radio frequency amplifier circuit 70. Specifically, when the level of the inputted signal is low, the power supply voltage Vcc is set low (1V), and when the level of the inputted signal is high, the power supply voltage Vcc is set high (3.6V). When the bias current flowing through the radio frequency amplifier circuit is changed in accordance with the power supply voltage Vcc, the operating current is changed, thereby changing power gain. Further, in the radio frequency circuit block of the mobile communication terminal, when the gain of the radio frequency amplifier circuit 70 is changed by changing the operation mode, a parameter contained in a correction table for the power gain is required to have the increased number of values, thereby complicating the control. Therefore, it is necessary to reduce a difference in power gain among the operation modes. According to the seventh embodiment, the difference in power gain among the operation modes is reduced in the following manner.

The two operation modes of the radio frequency amplifier circuit 70 will be described. A mode in which the radio frequency amplifier circuit 70 operates when the power supply voltage Vcc is 1V is defined as the operation mode 1. A mode in which the radio frequency amplifier circuit 70 operates when the power supply voltage Vcc is 3.6V is defined as the operation mode 2. When the radio frequency amplifier circuit 70 has two operation modes, a mode in which each of the amplifiers 11a and 11b operates when the power supply voltage Vcc is 1V is defined as the operation mode 1 in which the bias current is "small", and a mode in which each of the amplifiers 11a and 11b operates when the power supply voltage Vcc is 3.6V is defined as the operation mode 2 in which the bias current is "large". In the operation mode in which an input signal level is low, the bias current of the amplifier 11a is set so as to have a "large" value, and the bias current of the amplifier 11b is set so as to have a "small" value. On the other hand, in the operation mode in which the input signal level is high, the bias current of the amplifier 11a is set so as to have a "small" value, and the bias current of the amplifier 11b is set so as to have a "large" value. That is, the bias current of the amplifier 11a and the bias current of the amplifier 11b are set such that the bias current of the amplifier 11a and the bias current of the amplifier 11b have values which change so as to be inversely proportional to each other. Thus, the radio frequency amplifier circuit 70 is capable of reducing the difference in power gain among the respective operation modes.

According to the seventh embodiment, a relationship between input power and output power of the radio frequency signal of the radio frequency amplifier circuit 70, and a relationship between the power of the radio frequency signal outputted by the radio frequency amplifier circuit 70 and the current flowing through the collector of the amplifying transistor represent characteristics almost similar to those shown in FIGS. 20 and 21, and therefore the relationships are not shown for the seventh embodiment.

Exemplary manners in which the power supply voltages of the radio frequency amplifier circuit 70 are set, and an exemplary setting range in which each of the values of the resistances R2, R3, R4, R5, R6, R7, R8, R9, and R10 is set in each of the bias circuits 32a and 32b, are the same as described above. Further, when the mobile communication terminal and the radio frequency amplifier circuit have different control logics from each other, whether the radio frequency amplifier circuit 30 of the third embodiment or the radio frequency amplifier circuit 40 of the fourth embodiment is to be used may be determined based on the logic of the control signal. Thus, it is unnecessary to increase the circuit scale of the radio frequency amplifier circuit, and the radio frequency amplifier circuit can be used in a flexible manner. The bias circuits 32a and 32b may share the transistor Q6, the resistance R9, and the resistance R10, which have the same structure between the bias circuits 32a and 32b, thereby reducing the circuit scale of the bias circuit.

As described above, in the radio frequency amplifier circuit and the mobile communication terminal according to the seventh embodiment of the present invention, the number of amplifiers provided is increased so as to connect the amplifiers to each other such that, when the power gain is increased by controlling the bias current of the amplifier, the bias circuits supply, to the respective corresponding amplifiers, the bias currents which have values changing so as to be inversely proportional to each other. Therefore, the change of the power gain in accordance with the power supply voltage can be suppressed.

In each of the embodiments described above, also when a field-effect transistor is used as each of the transistors Q4 and Q7 for changing a bias, the changing operation similar to that described above can be realized.

Further, it is preferable that the voltage between the base and the emitter of each of the transistors used in the bias circuit and the amplifier has the substantially same value.

Moreover, in the third and the fourth embodiments, even when the power supply voltage Vcc may be applied via the resistance R5 to the base of the transistor Q4 without providing the transistor Q6, the resistance R9, and the resistance R10, the same control as described above can be realized.

While the invention has been described in detail, the foregoing description is in all aspects illustrative and not restrictive. It is understood that numerous other modifications and variations can be devised without departing from the scope of the invention.

What is claimed is:

1. A radio frequency amplifier circuit for amplifying a radio frequency signal, comprising:
   a bias circuit operable to generate a bias current, wherein an amount of the bias current is changeable in accordance with a control signal, and
   an amplifier operable to amplify, by using the bias current supplied by the bias circuit, the radio frequency signal having been inputted thereto,
   wherein each of the first bias circuit and the second bias circuit includes:
      a bias supply transistor operable to supply, to each of the first amplifier and the second amplifier, each of the first bias current and the second bias current in accordance with a base current supplied thereto;
      a first temperature compensation transistor operable to pass a current in accordance with a reference voltage;
      a second temperature compensation transistor operable to correct, in accordance with the current passed by the first temperature compensation transistor, the base current to be supplied to the bias supply transistor, so as to compensate a temperature characteristic represented by the bias supply transistor; and
      a bias changing section, connected to a base of the second temperature compensation transistor, operable to change, in accordance with the control signal, an amount of the base current to be supplied to the bias supply transistor.

2. The radio frequency amplifier circuit according to claim 1, wherein the control signal is a control voltage applied from outside.

3. The radio frequency amplifier circuit according to claim 1, wherein the control signal is a power supply voltage applied to the amplifier.

4. The radio frequency amplifier circuit according to claim 1, wherein the control signal is a power supply voltage applied to the amplifier.

5. The radio frequency amplifier circuit according to claim 2, wherein
   the bias changing section includes:
      a bias changing transistor having a base to which the control voltage is applied; and
      a resistance connected to at least one of a collector and an emitter of the bias changing transistor; and
   the bias changing section increases, when the bias changing transistor functions, the amount of the base current to be supplied to the bias supply transistor.

6. The radio frequency amplifier circuit according to claim 3, wherein
   the bias changing section includes:
      a bias changing transistor having a base to which a voltage is applied in accordance with the power supply voltage; and
      a resistance connected to at least one of a collector and an emitter of the bias changing transistor; and
   the bias changing section reduces, when the bias changing transistor functions, the amount of the base current to be supplied to the bias supply transistor.

7. The radio frequency amplifier circuit according to claim 4, wherein
   the bias changing section includes:
      a bias changing transistor having a base to which a voltage is applied in accordance with the power supply voltage; and
      a resistance connected to at least one of a collector and an emitter of the bias changing transistor; and
   the bias changing section increases, when the bias changing transistor functions, the amount of the base current to be supplied to the bias supply transistor.

8. The radio frequency amplifier circuit according to claim 4, wherein
   the bias changing section connected to the base of the bias supply transistor includes
      a bias changing transistor having a base to which a voltage is applied in accordance with the power supply voltage, and
      a resistance connected to at least one of a collector and an emitter of the bias changing transistor,
   the bias changing section connected to the base of the bias supply transistor reduces, when the bias changing transistor functions, the amount of the base current to be supplied to the bias supply transistor,
   the bias changing section connected to the base of the second temperature compensation transistor includes
      a bias changing transistor having a base to which a voltage is applied in accordance with the power supply voltage, and
      a resistance connected to at least one of a collector and an emitter of the bias changing transistor, and
   the bias changing section connected to the base of the second temperature compensation transistor increases, when the bias changing transistor functions, the amount of the base current to be supplied to the bias supply transistor.

9. The radio frequency amplifier circuit according to claim 6, wherein the bias changing section further includes a second bias changing transistor having a base to which the reference voltage is applied, a collector to which the power supply voltage is applied, and an emitter connected to the base of the bias changing transistor.

10. The radio frequency amplifier circuit according to claim 4, wherein the bias changing section further includes a second bias changing transistor having a base to which the reference voltage is applied, a collector to which the power supply voltage is applied, and an emitter connected to the base of the bias changing transistor.

11. The radio frequency amplifier circuit according to claim 8, wherein the bias changing section further includes a second bias changing transistor having a base to which the reference voltage is applied, a collector to which the power supply voltage is applied, and an emitter connected to the base of the bias changing transistor.

12. The radio frequency amplifier circuit according to claim 5, wherein a voltage between a base and an emitter of a transistor used in the bias circuit is substantially equal to a voltage between a base and an emitter of a transistor used in the amplifier.

13. The radio frequency amplifier circuit according to claim 6, wherein a voltage between a base and an emitter of a transistor used in the bias circuit is substantially equal to a voltage between a base and an emitter of a transistor used in the amplifier.

14. The radio frequency amplifier circuit according to claim 7, wherein a voltage between a base and an emitter of a transistor used in the bias circuit is substantially equal to a voltage between a base and an emitter of a transistor used in the amplifier.

15. The radio frequency amplifier circuit according to claim 8, wherein a voltage between a base and an emitter of a transistor used in the bias circuit is substantially equal to a voltage between a base and an emitter of a transistor used in the amplifier.

16. The radio frequency amplifier circuit according to claim 5, wherein the bias changing transistor is a field-effect transistor.

17. The radio frequency amplifier circuit according to claim 6, wherein the bias changing transistor is a field-effect transistor.

18. The radio frequency amplifier circuit according to claim 7, wherein the bias changing transistor is a field-effect transistor.

19. The radio frequency amplifier circuit according to claim 8, wherein the bias changing transistor is a field-effect transistor.

20. The radio frequency amplifier circuit according to claim 1, wherein the control signal and the radio frequency signal are inputted from a same terminal.

21. A mobile communication terminal comprising a radio frequency circuit block which includes a synthesizer section, a transmission section, a reception section, a common use unit, and a control signal output section, wherein
    the transmission section includes
        a modulator operable to convert an inputted modulation signal into a transmission signal of a predetermined transmission frequency;
        a radio frequency amplifier circuit, capable of changing a gain, operable to amplify the transmission signal obtained by conversion performed by the modulator;
        a band-pass filter operable to extract a signal of a predetermined band from the transmission signal having been amplified by the radio frequency amplifier circuit;
        the radio frequency amplifier circuit according to claim 1 operable to amplify, using a fixed gain, the signal extracted by the band-pass filter; and
        an isolator, provided between the common use unit and the radio frequency amplifier circuit using the fixed gain, operable to unidirectionally pass a signal to the common use unit from the radio frequency amplifier circuit using the fixed gain.

* * * * *